United States Patent
Ishizaki

(10) Patent No.: US 12,438,101 B2
(45) Date of Patent: Oct. 7, 2025

(54) BONDED SEMICONDUCTOR LIGHT-RECEIVING DEVICE AND METHOD FOR MANUFACTURING BONDED SEMICONDUCTOR LIGHT-RECEIVING DEVICE

(71) Applicant: SHIN-ETSU HANDOTAI CO., LTD., Tokyo (JP)

(72) Inventor: Junya Ishizaki, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 434 days.

(21) Appl. No.: 17/928,308

(22) PCT Filed: Jun. 8, 2021

(86) PCT No.: PCT/JP2021/021655
§ 371 (c)(1),
(2) Date: Nov. 29, 2022

(87) PCT Pub. No.: WO2022/004292
PCT Pub. Date: Jan. 6, 2022

(65) Prior Publication Data
US 2023/0215817 A1    Jul. 6, 2023

(30) Foreign Application Priority Data
Jul. 3, 2020 (JP) .................... 2020-115665

(51) Int. Cl.
*H01L 23/00* (2006.01)
*H10F 71/00* (2025.01)
(Continued)

(52) U.S. Cl.
CPC ....... *H01L 23/562* (2013.01); *H10F 71/1272* (2025.01); *H10F 71/139* (2025.01);
(Continued)

(58) Field of Classification Search
CPC ............... H01L 23/562; H01L 21/185; H01L 21/30612; H01L 21/78; H01L 21/7806;
(Continued)

(56) References Cited

U.S. PATENT DOCUMENTS 6,072,227 A * 6/2000 Yau ............... H01L 21/76828
257/E21.279
7,960,246 B2   6/2011 Flamand et al.
(Continued)

FOREIGN PATENT DOCUMENTS

CN   102655199 A   9/2012
CN   110581201 A   12/2019
(Continued)

OTHER PUBLICATIONS

Aug. 24, 2021 Search Report issued in International Patent Application No. PCT/JP2021/021655.
(Continued)

*Primary Examiner* — Earl N Taylor
(74) *Attorney, Agent, or Firm* — Oliff PLC

(57) ABSTRACT

A bonded semiconductor light-receiving device including an epitaxial layer to serve as a device-functional layer, and a support substrate made of a material different from that of the device-functional layer and bonded to the epitaxial layer via a bonding material layer. The device-functional layer has a bonding surface with an uneven pattern formed thereon.

16 Claims, 13 Drawing Sheets

(51) Int. Cl.
*H10F 77/124* (2025.01)
*H10F 77/70* (2025.01)

(52) U.S. Cl.
CPC ....... *H10F 77/1248* (2025.01); *H10F 77/703* (2025.01); *H10F 77/707* (2025.01)

(58) Field of Classification Search
CPC ............ H01L 31/1896; H01L 31/1852; H01L 31/105; H01L 31/02363; H01L 31/02366; H01L 31/03046; H01L 31/1844; H01L 31/1892; H10F 71/1272; H10F 71/139; H10F 77/1248; H10F 77/703; H10F 71/1395; H10F 71/1276; H10F 30/223; H10F 77/707; Y02P 70/50

See application file for complete search history.

(56) References Cited

U.S. PATENT DOCUMENTS

| | | | |
|---|---|---|---|
| 8,916,899 | B2 | 12/2014 | Won |
| 12,010,866 | B2 | 6/2024 | Lee et al. |
| 2003/0164505 | A1 | 9/2003 | Streubel et al. |
| 2005/0272222 | A1 | 12/2005 | Flamand et al. |
| 2006/0163595 | A1 | 7/2006 | Hsieh et al. |
| 2007/0257269 | A1 | 11/2007 | Cho et al. |
| 2011/0207299 | A1 | 8/2011 | Sakurai |
| 2011/0226319 | A1* | 9/2011 | Soderstrom ............. H10F 77/70 257/E31.13 |
| 2012/0273043 | A1* | 11/2012 | Lochtefeld ............ H10F 71/127 438/57 |
| 2013/0146131 | A1* | 6/2013 | Cuony .................. H10F 77/707 438/71 |
| 2013/0222770 | A1 | 8/2013 | Tomiyama |
| 2014/0077224 | A1 | 3/2014 | Li et al. |
| 2017/0341600 | A1 | 11/2017 | Kannzaki et al. |
| 2020/0126932 | A1* | 4/2020 | Kim ..................... H01L 23/585 |
| 2021/0020814 | A1 | 1/2021 | Koshika et al. |
| 2021/0151715 | A1 | 5/2021 | Lee et al. |
| 2021/0226078 | A1* | 7/2021 | Derkacs ................ H10F 77/124 |
| 2023/0215976 | A1* | 7/2023 | Ishizaki ................. H10H 20/82 257/98 |

FOREIGN PATENT DOCUMENTS

| | | |
|---|---|---|
| JP | H07-130283 A | 5/1995 |
| JP | H08-162664 A | 6/1996 |
| JP | H09-063951 A | 3/1997 |
| JP | 2001-102668 A | 4/2001 |
| JP | 2002-033475 A | 1/2002 |
| JP | 2006-210916 A | 8/2006 |
| JP | 2007-095855 A | 4/2007 |
| JP | 2008-066554 A | 3/2008 |
| JP | 2009-156781 A | 7/2009 |
| JP | 2010-114203 A | 5/2010 |
| JP | 2010-192645 A | 9/2010 |
| JP | 2011-159657 A | 8/2011 |
| JP | 2012-146806 A | 8/2012 |
| JP | 5008308 B2 | 8/2012 |
| JP | 2013120824 A | 6/2013 |
| JP | 2014-512699 A | 5/2014 |
| JP | 2017-228569 A | 12/2017 |
| JP | 2018-018920 A | 2/2018 |
| JP | 2019-186539 A | 10/2019 |
| KR | 20070117336 A | 12/2007 |
| KR | 20080023116 A | 3/2008 |
| KR | 10-2013-0059228 A | 6/2013 |
| KR | 20170142688 A | 12/2017 |
| WO | 2019102738 A1 | 5/2019 |

OTHER PUBLICATIONS

Dec. 13, 2022 International Preliminary Report on Patentability issued in International Patent Application No. PCT/JP2021/021655.
Aug. 24, 2021 Search Report issued in International Patent Application No. PCT/JP2021/021656.
Dec. 13, 2022 International Preliminary Report on Patentability issued in International Patent Application No. PCT/JP2021/021656.
U.S. Appl. No. 17/928,307, filed Nov. 29, 2022, on behalf of Junya Ishizaki.
Aug. 29, 2023 Office Action issued in Japanese Patent Application No. 2020-115608.
Nov. 20, 2024 Office Action issued in Taiwanese Patent Application No. 110122007.
Sep. 17, 2024 Extended European Search Report issued in European Patent Application No. 21834175.8.
May 30, 2023 Office Action issued in Japanese Patent Application No. 2020-115608.
May 23, 2023 Office Action issued in Japanese Patent Application No. 2020-115665.
Jan. 31, 2023 Office Action issued in Japanese Patent Application No. 2020-115665.
Jun. 28, 2024 Extended Search Report issued in European Patent Application No. 21834367.1.
Apr. 21, 2025 Office Action issued in U.S. Appl. No. 17/928,307.
Feb. 11, 2025 Office Action issued in Taiwanese Patent Application No. 110122006.

\* cited by examiner

[FIG. 1]
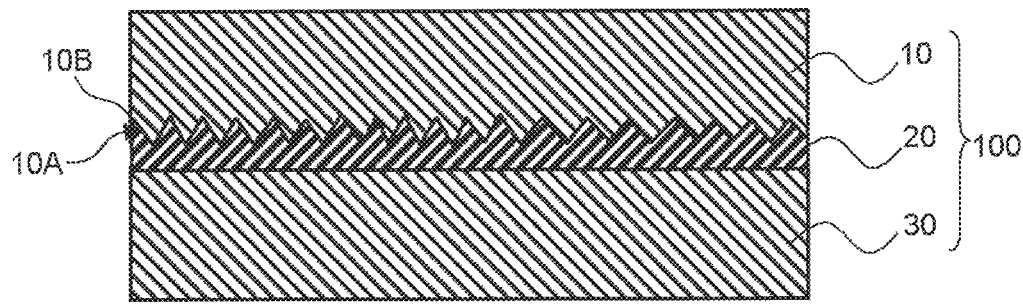
[FIG. 2]
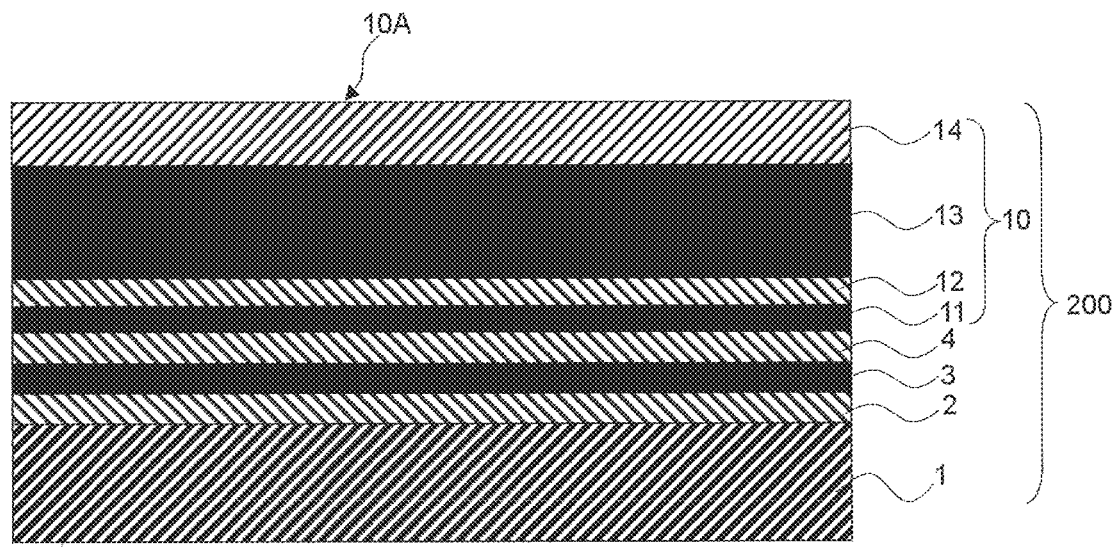
[FIG. 3]
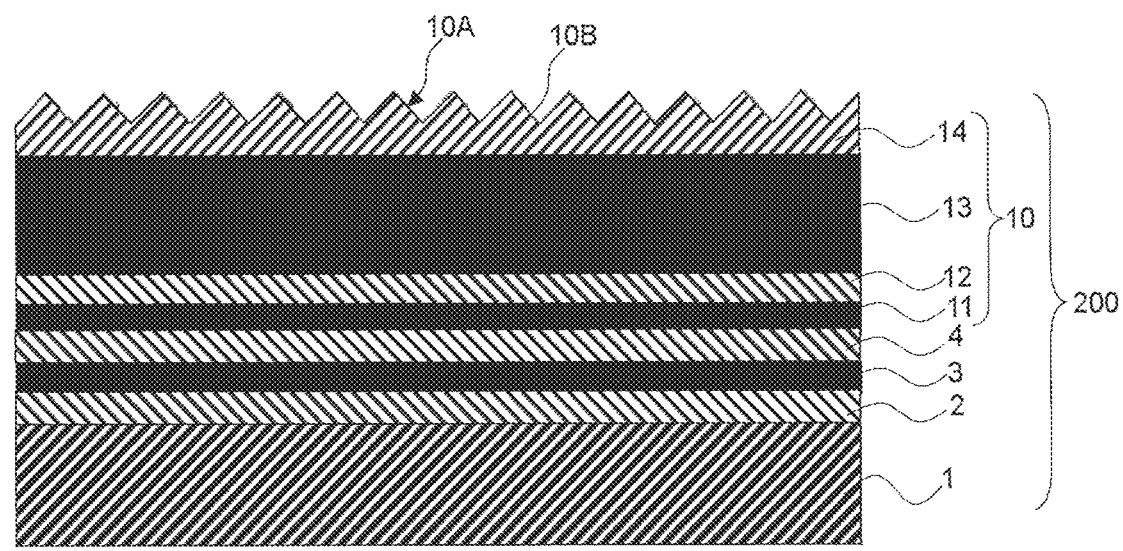

[FIG. 4]
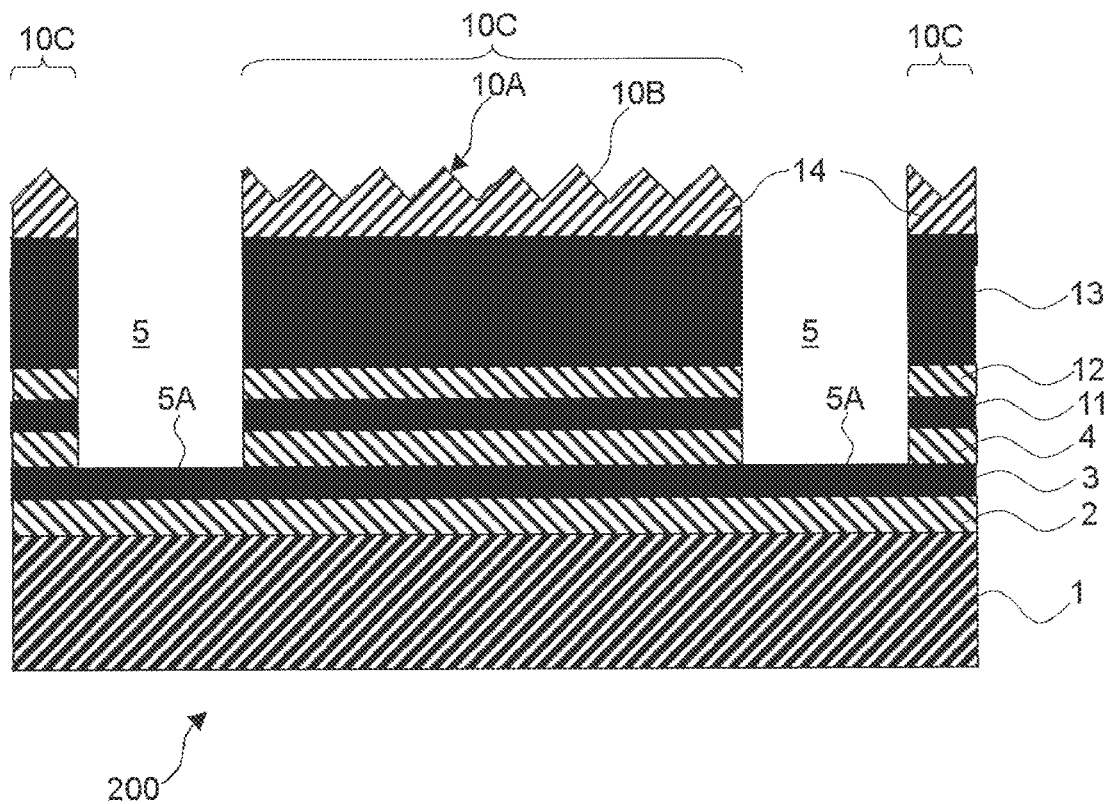
[FIG. 5]
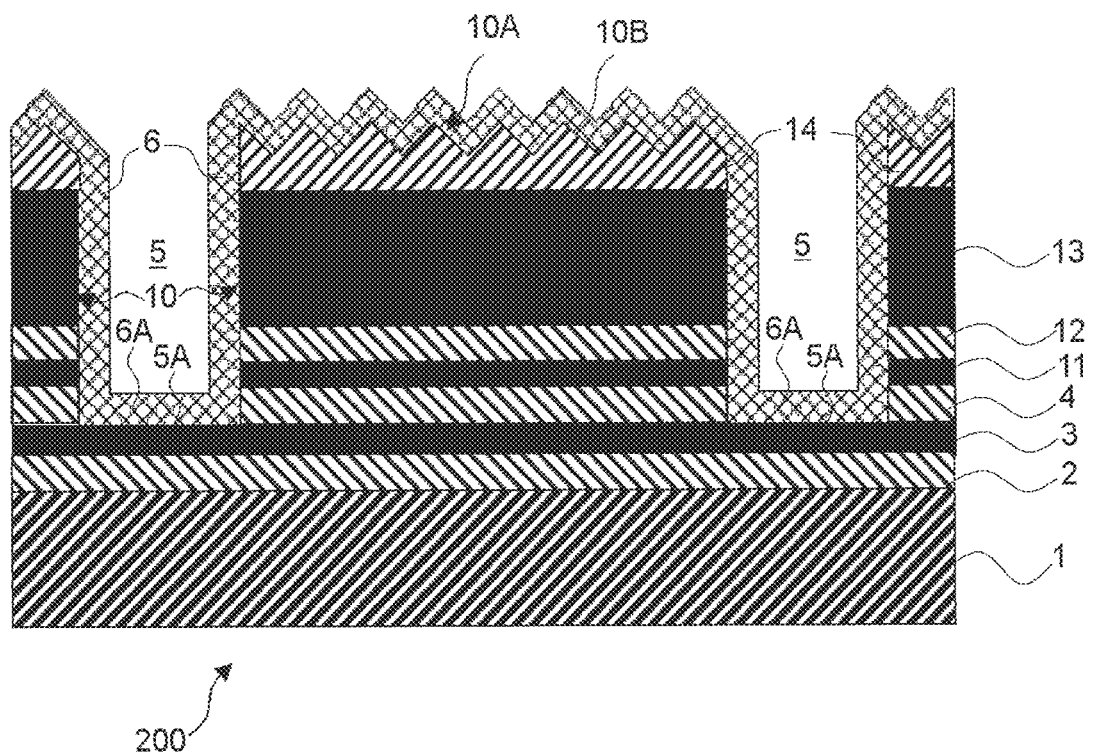

[FIG. 6]
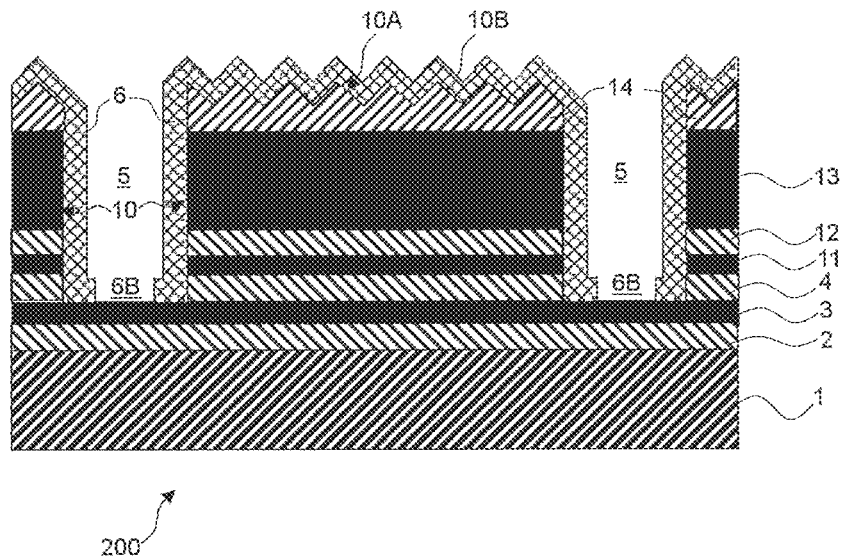
[FIG. 7]
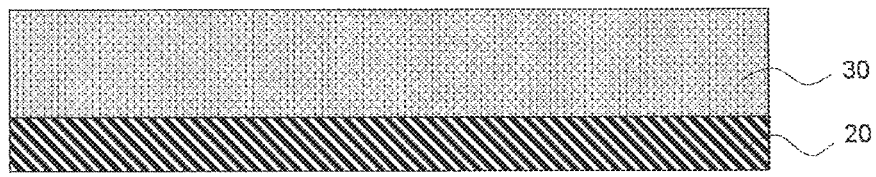
[FIG. 8]
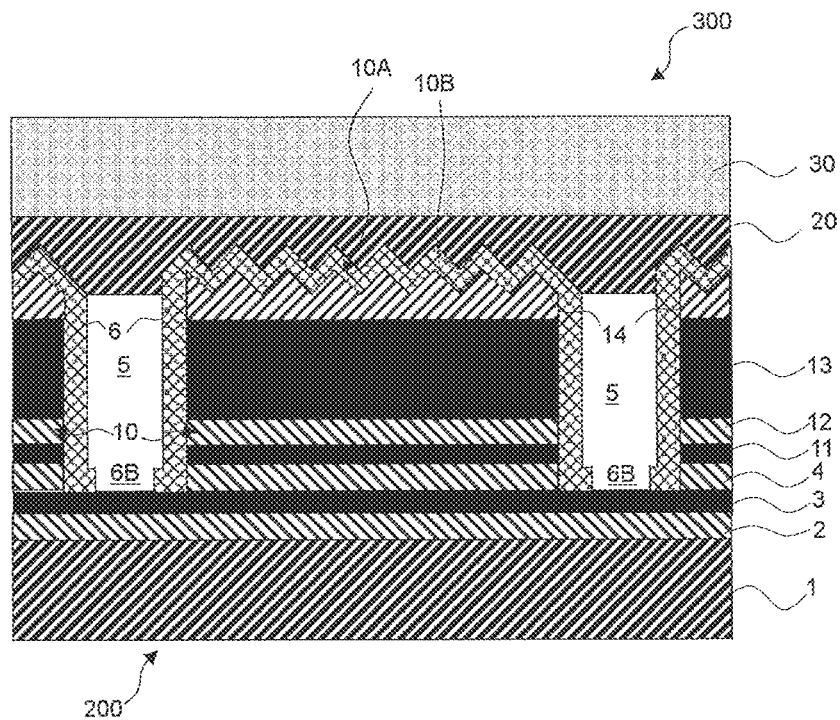

[FIG. 9]
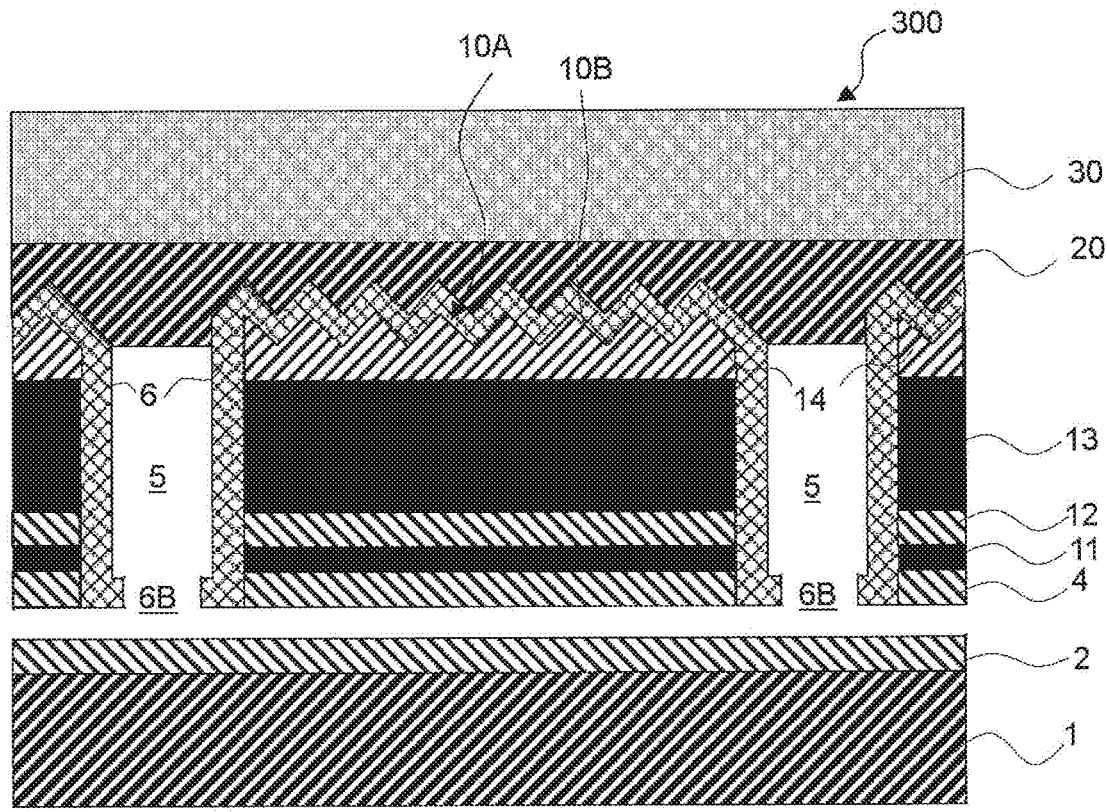
[FIG. 10]
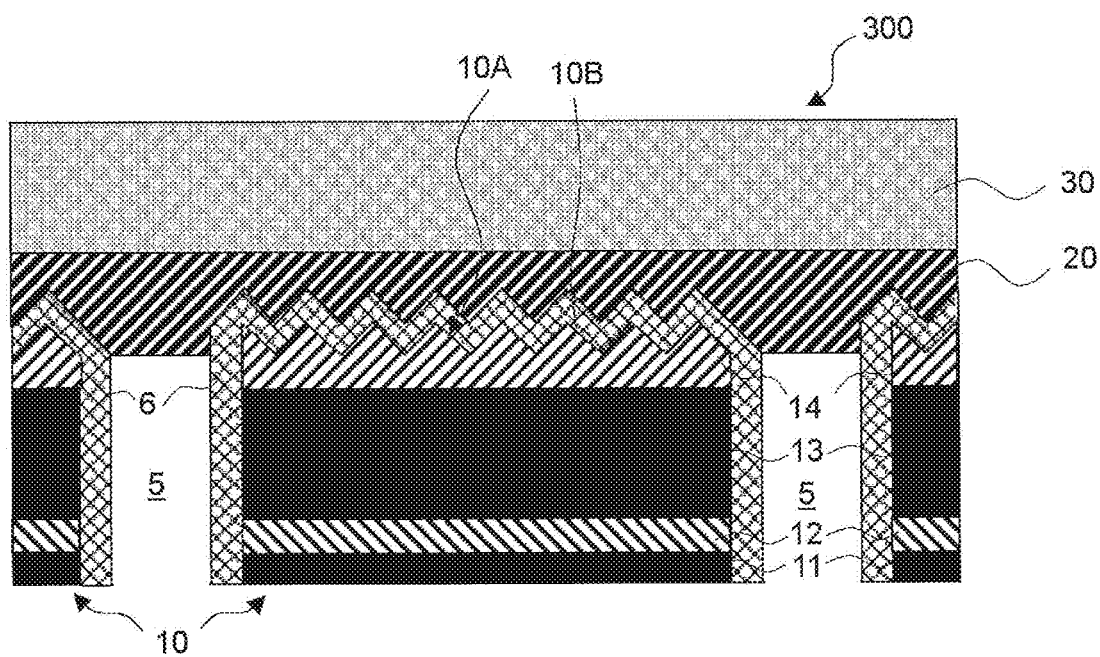

[FIG. 11]
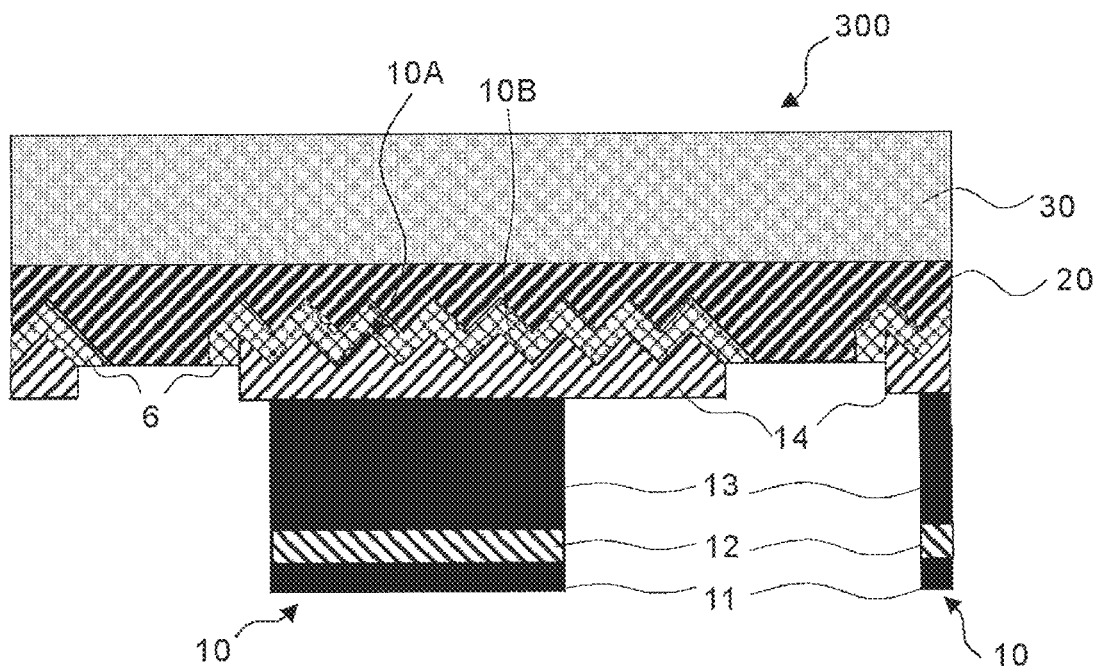
[FIG. 12]
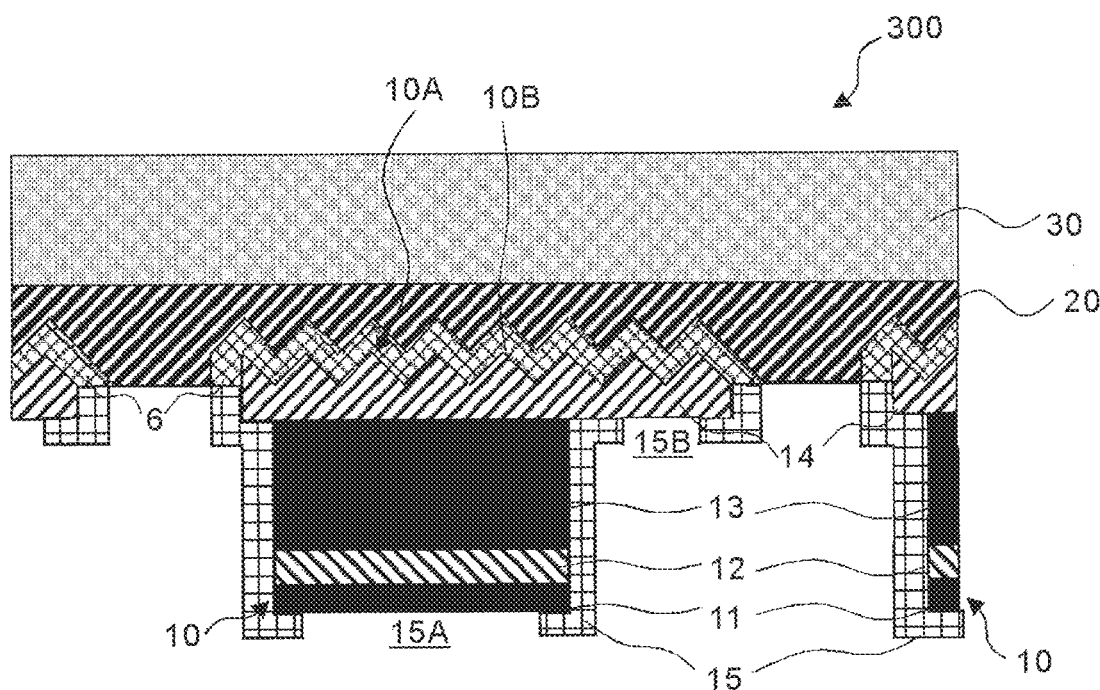

[FIG. 13]
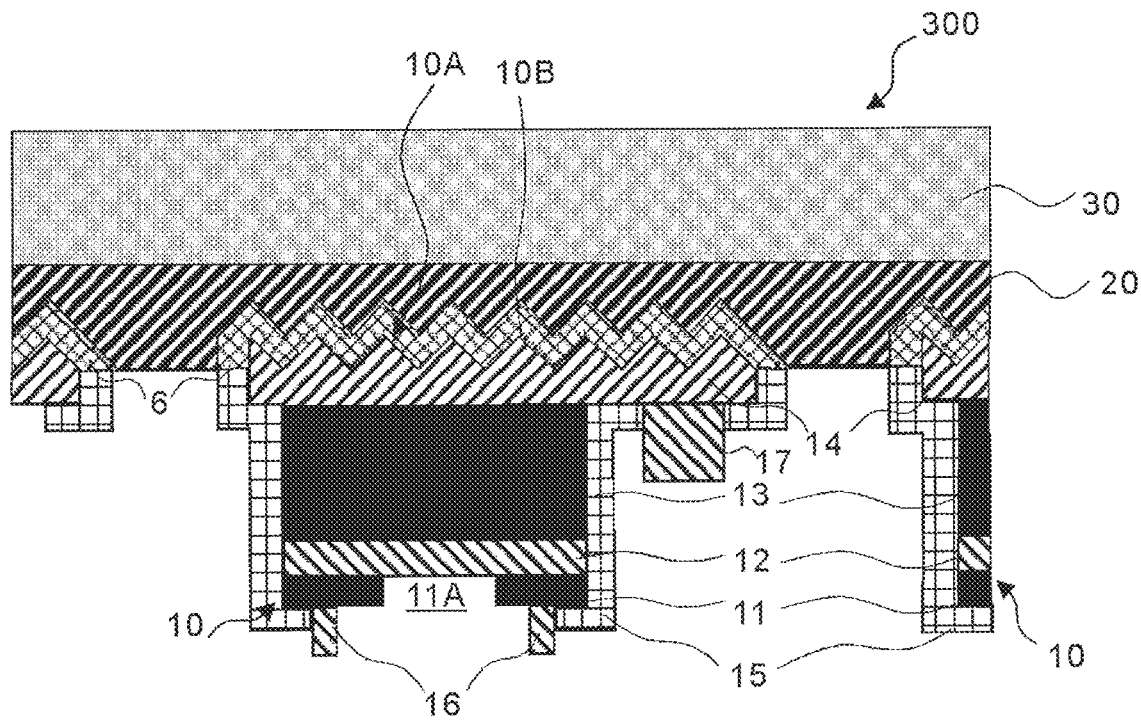
[FIG. 14]
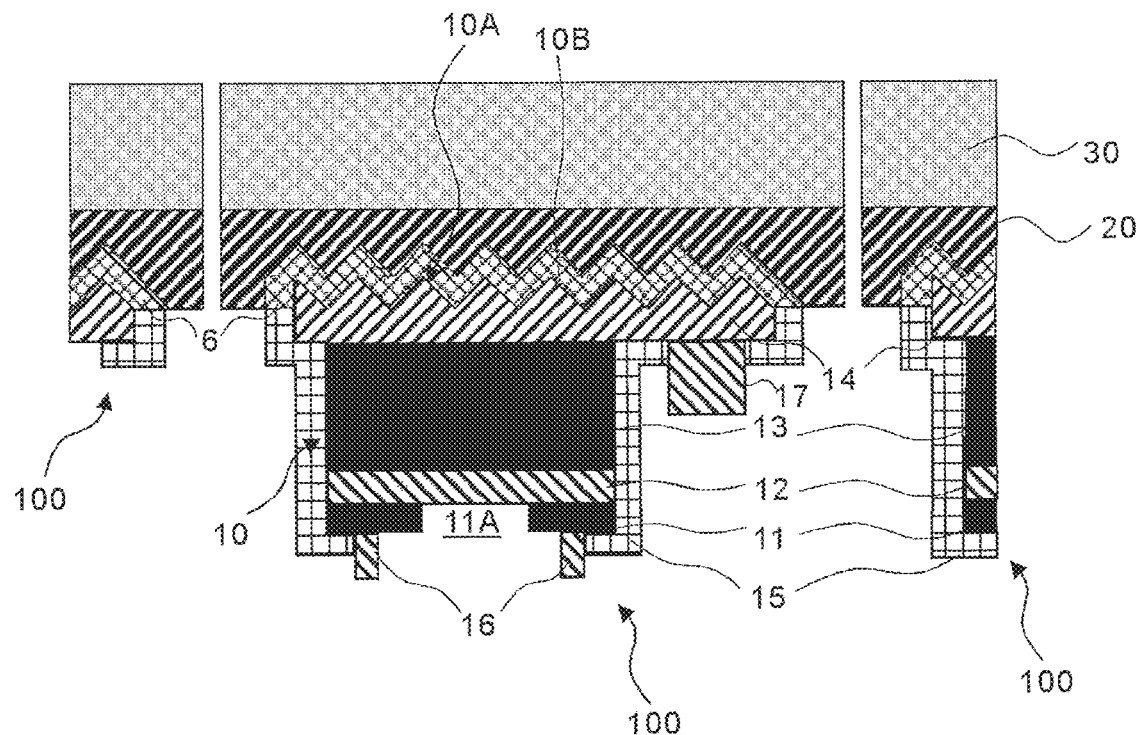

[FIG. 15]
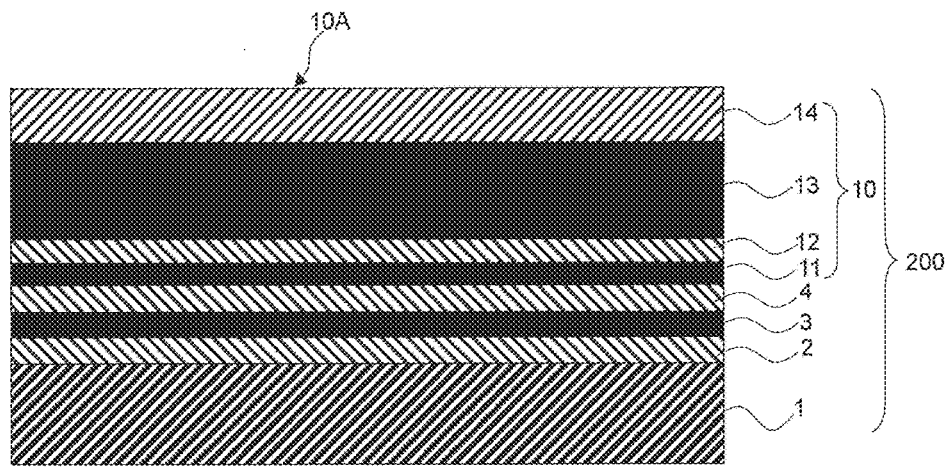
[FIG. 16]
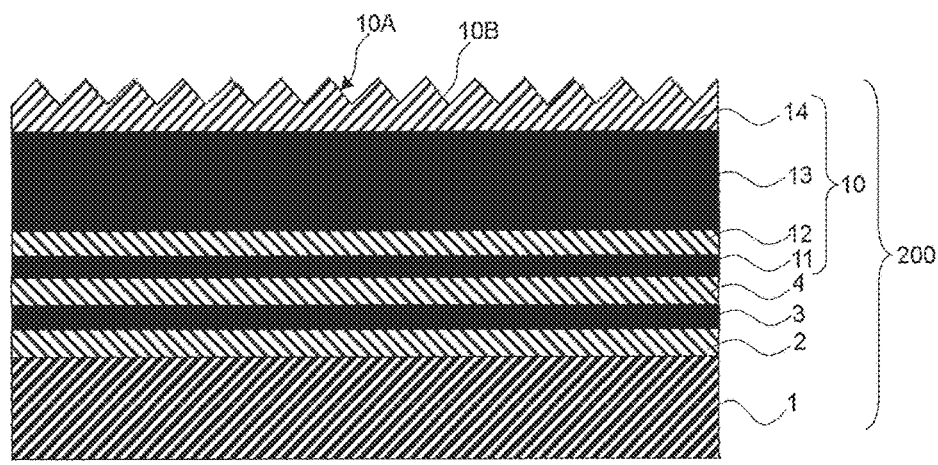
[FIG. 17]
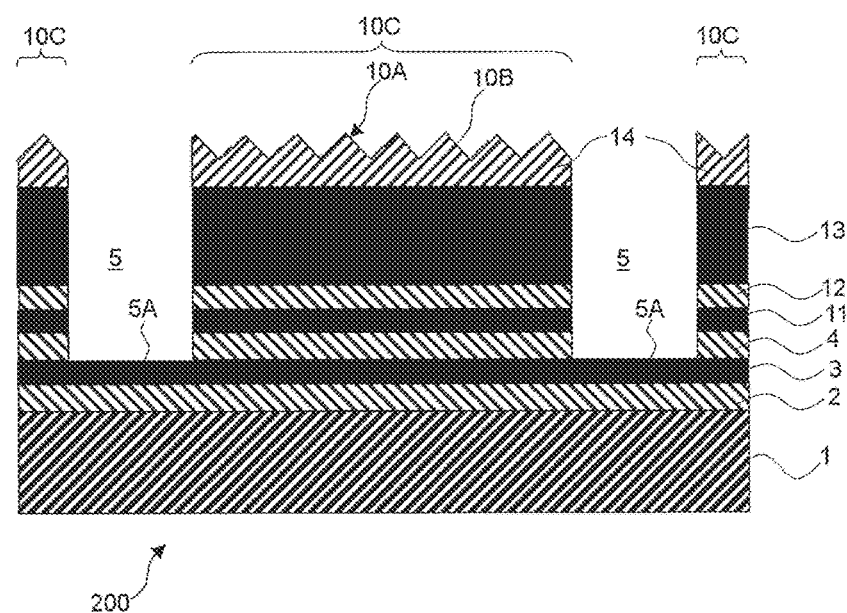

[FIG. 18]
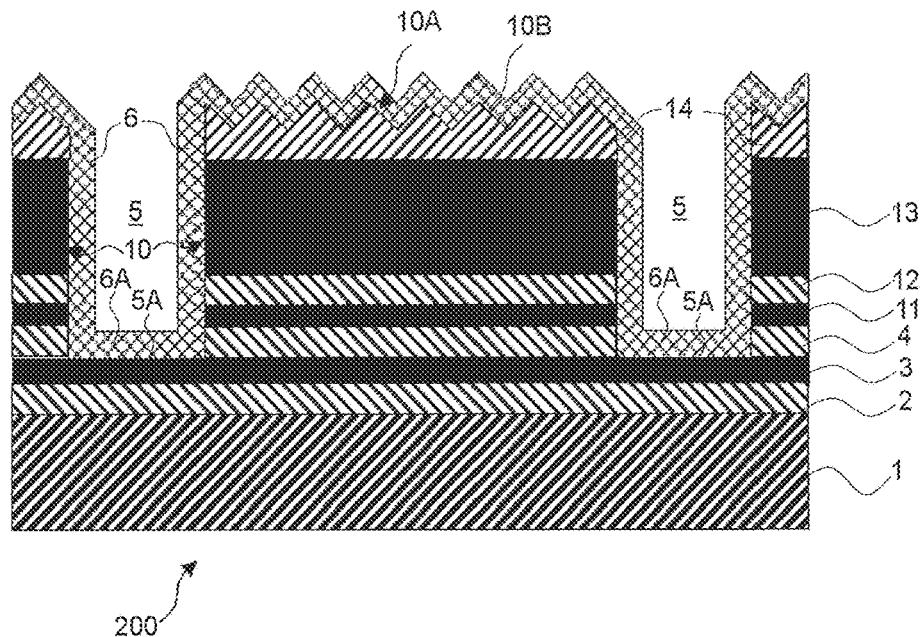
[FIG. 19]
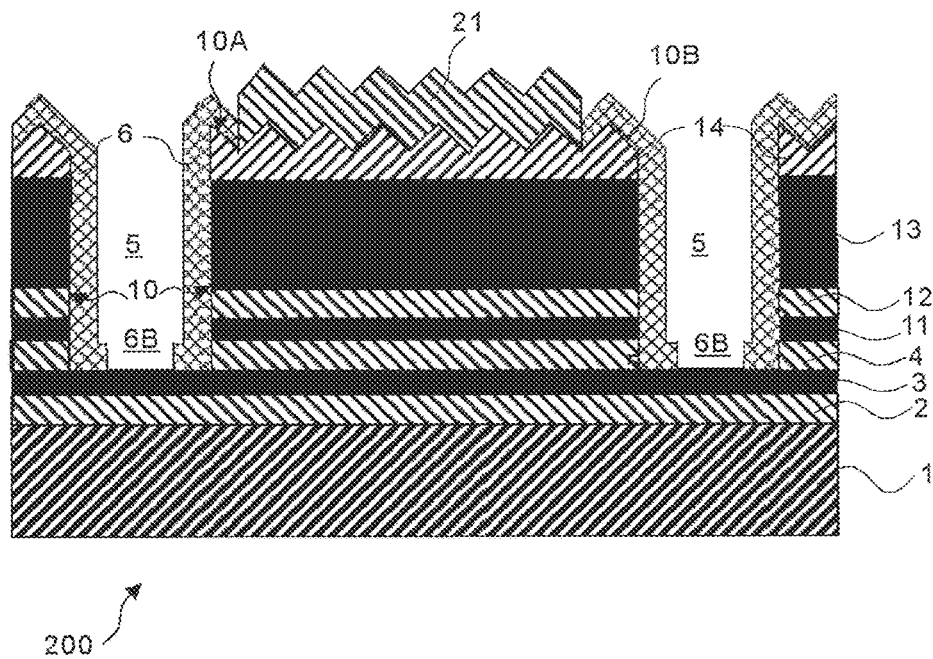
[FIG. 20]
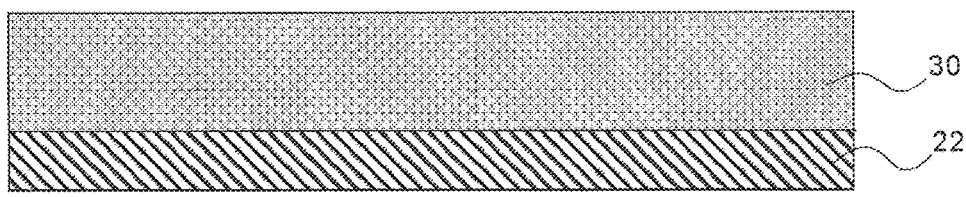

[FIG. 21]
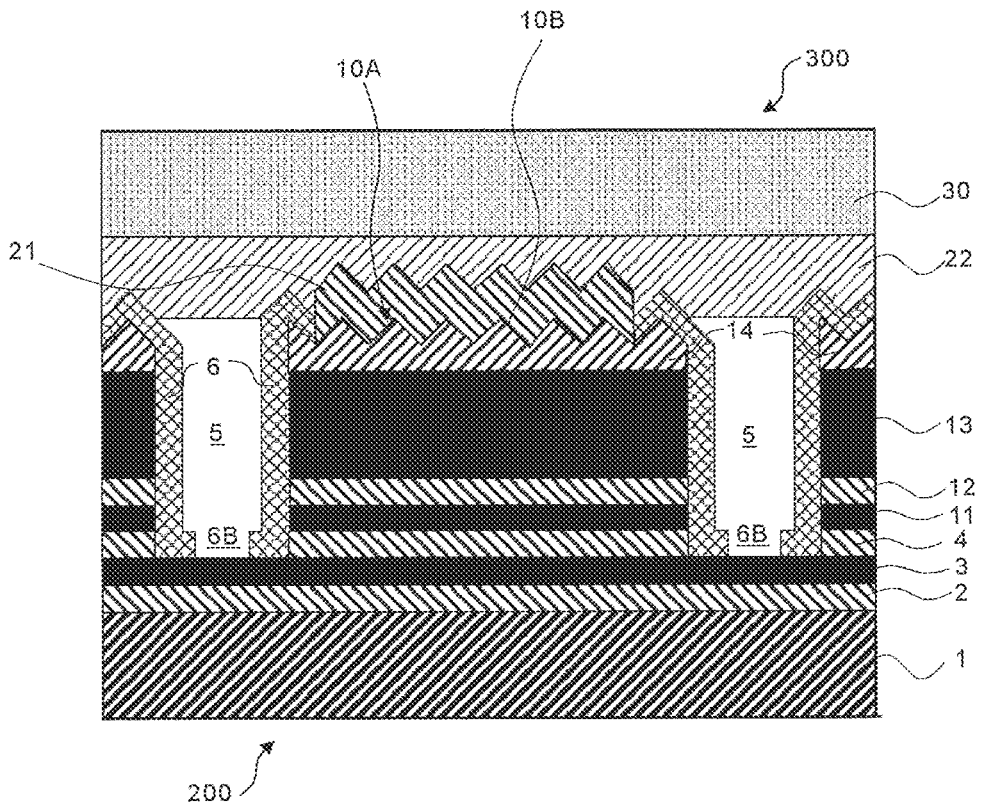
[FIG. 22]
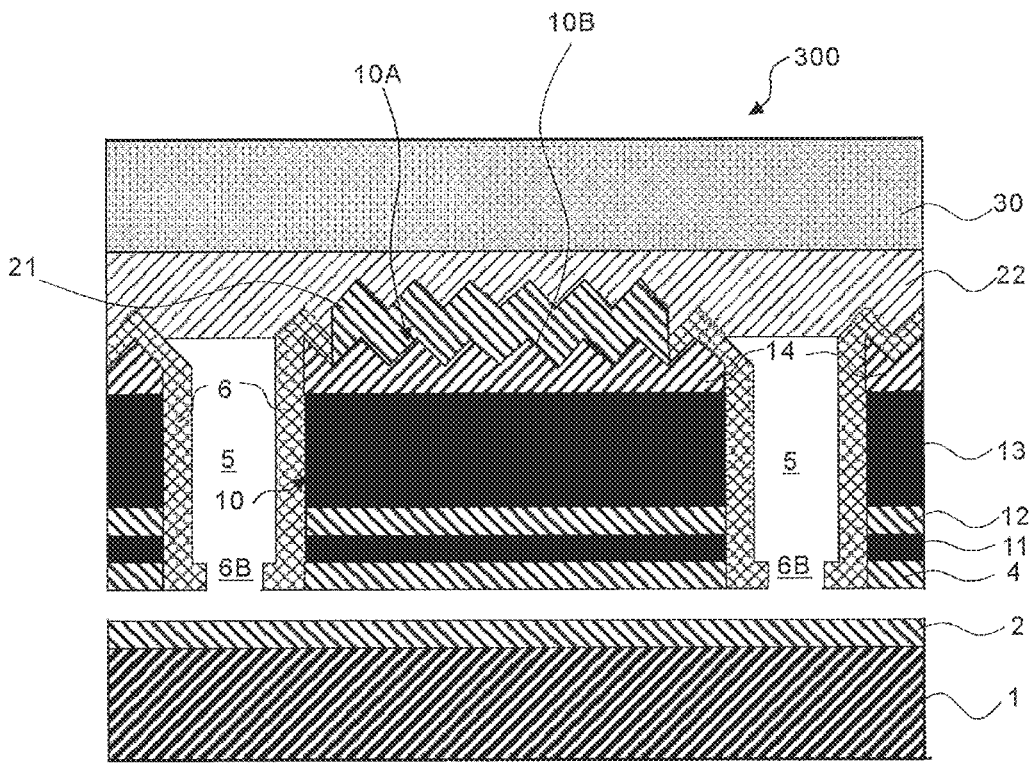

[FIG. 23]
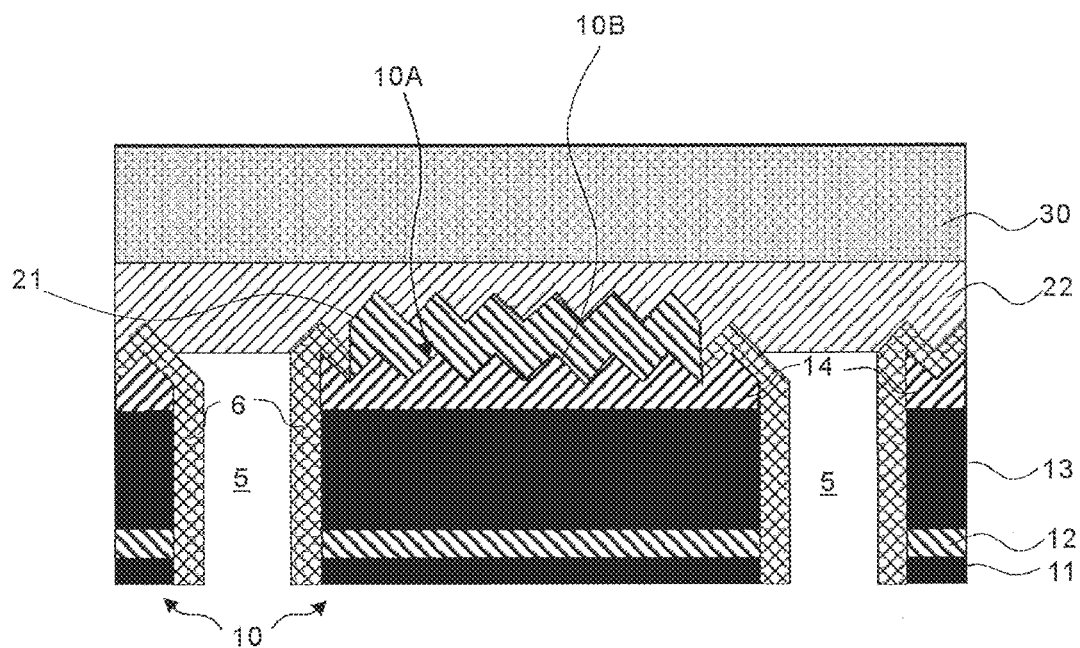
[FIG. 24]
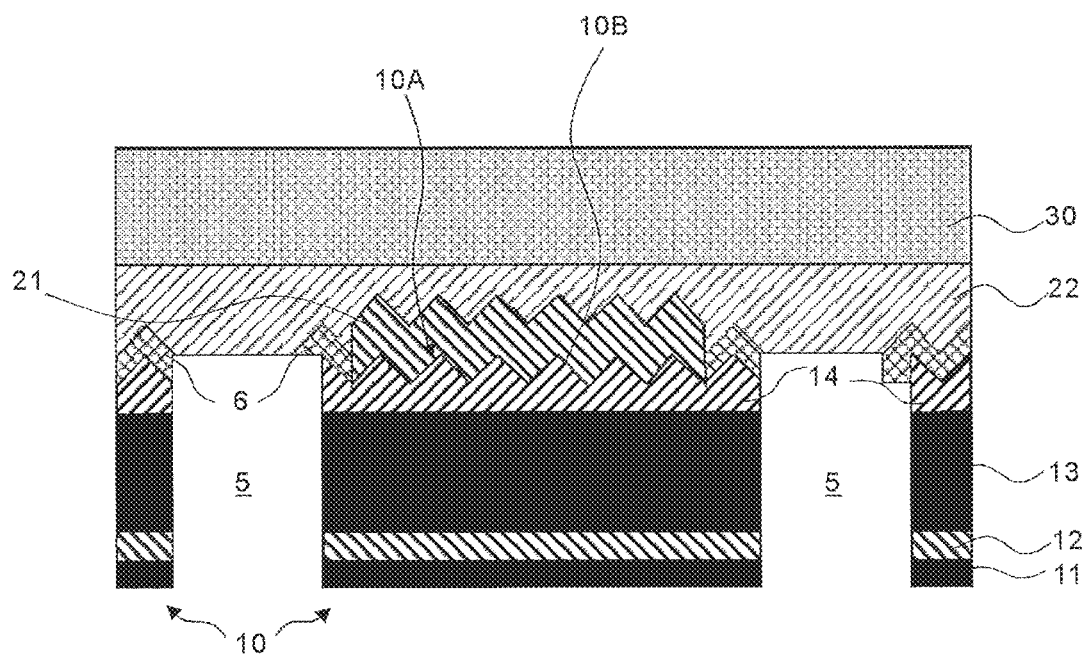

[FIG. 25]
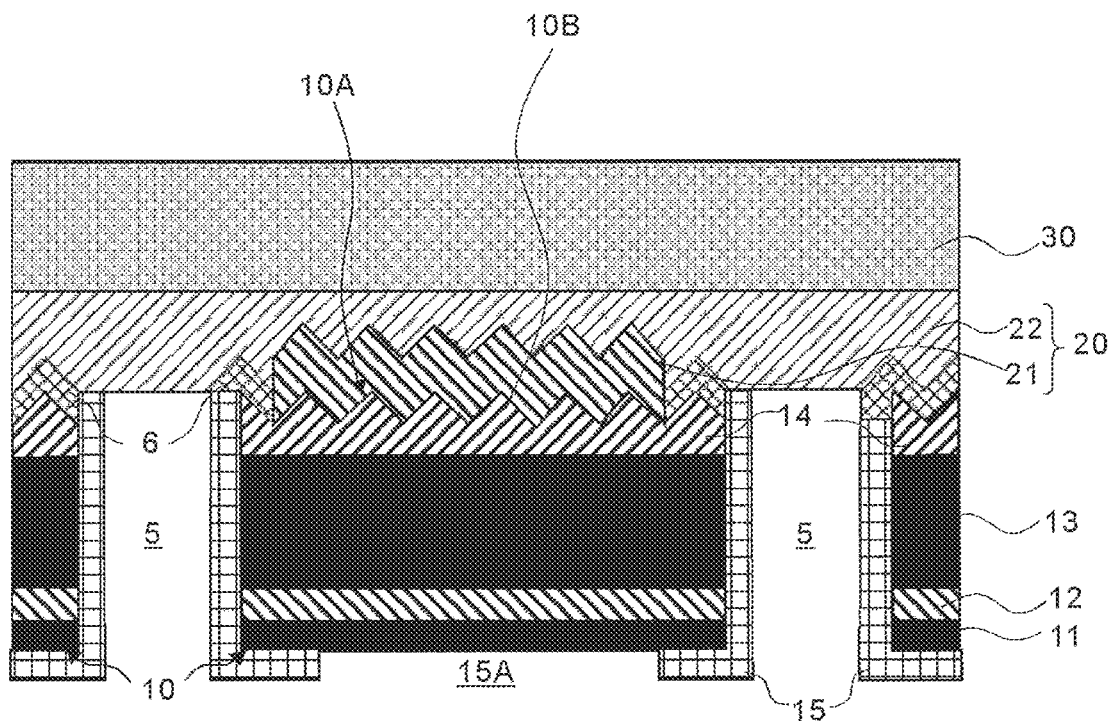
[FIG. 26]
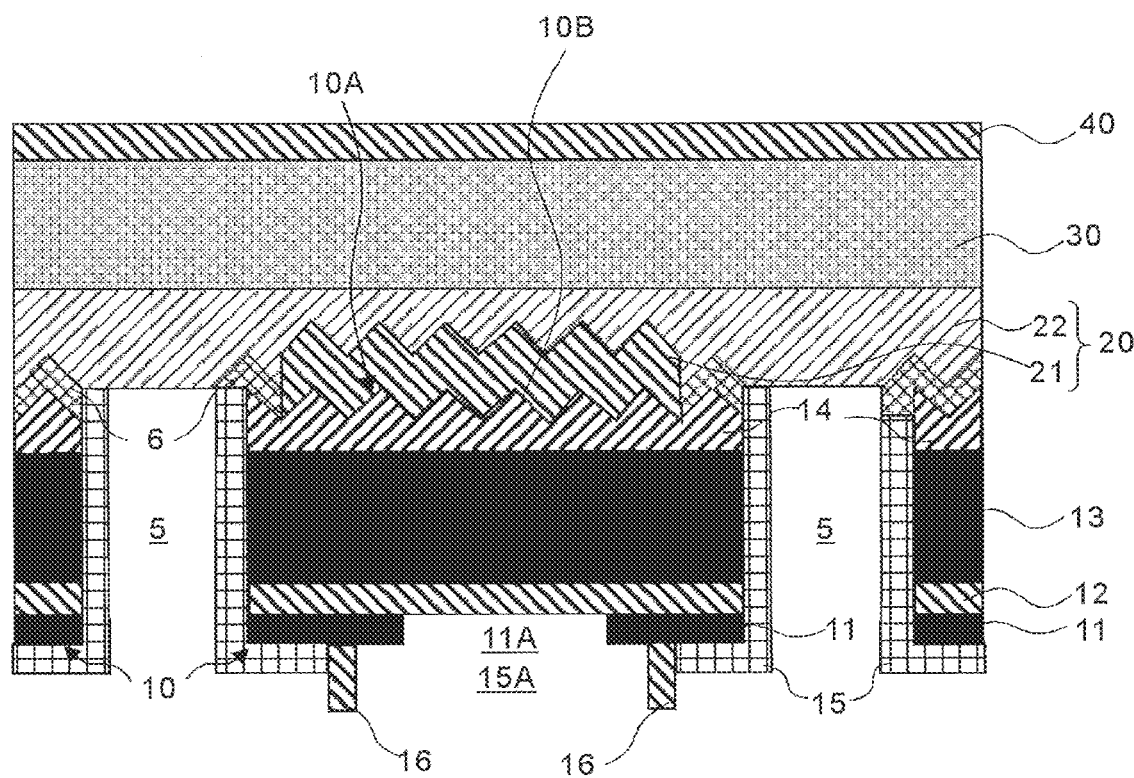

[FIG. 27]
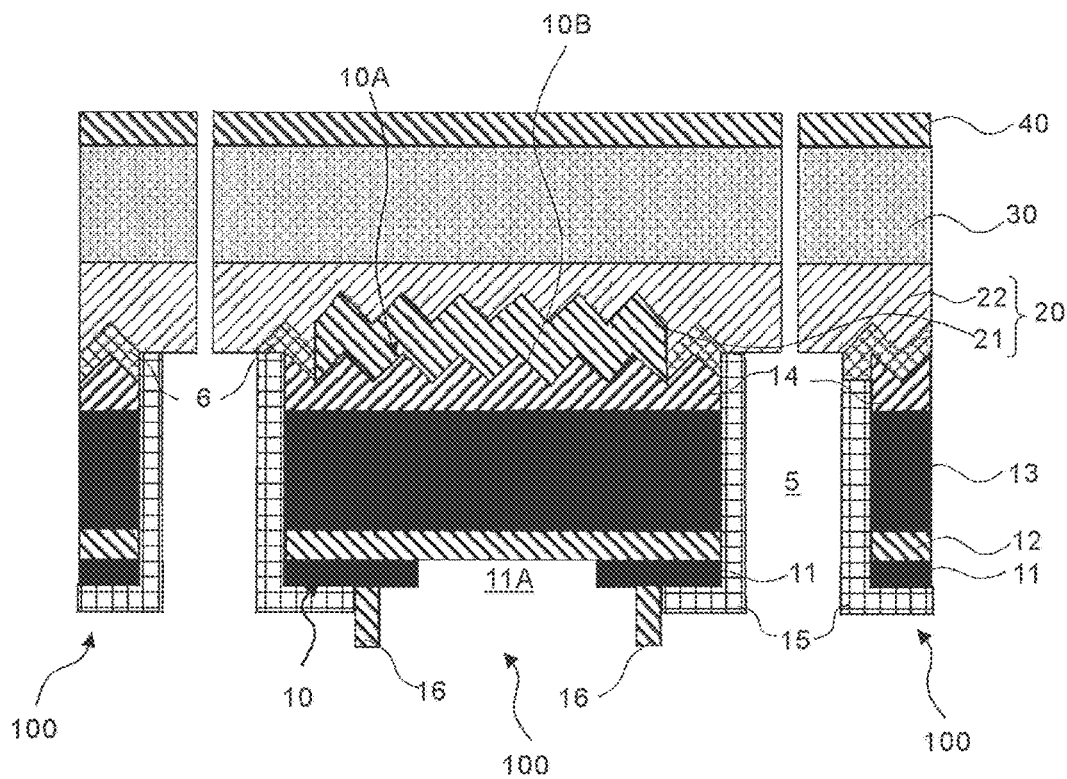
[FIG. 28]
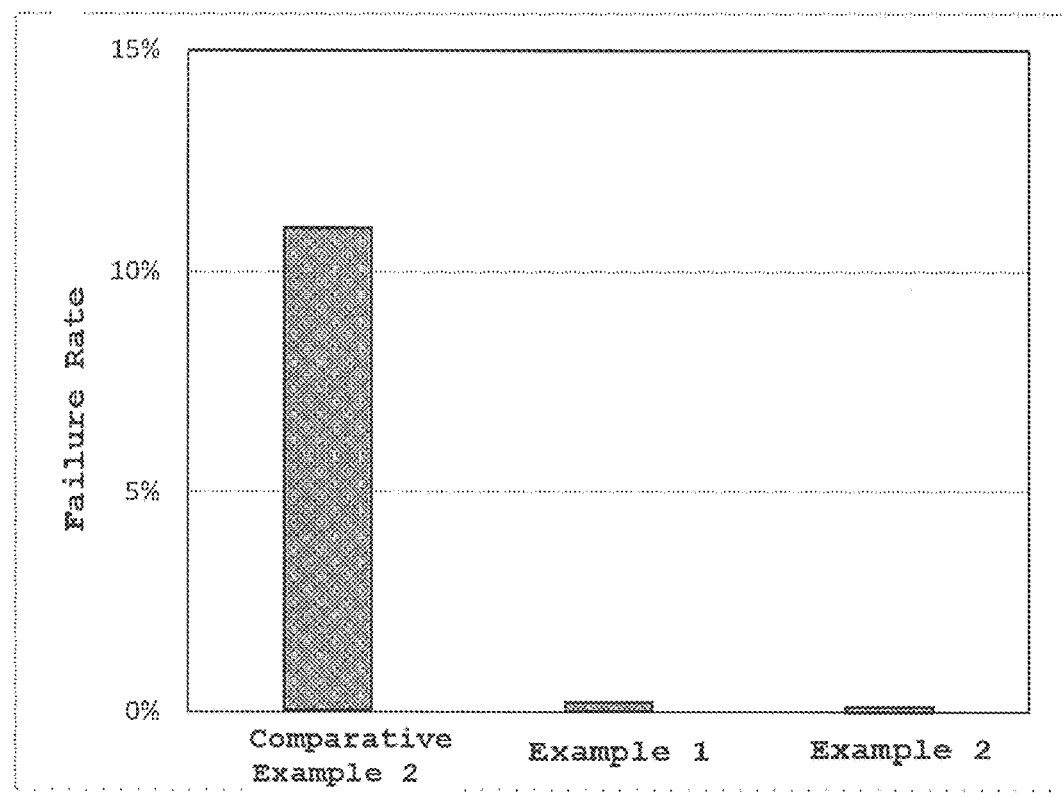

[FIG. 29]
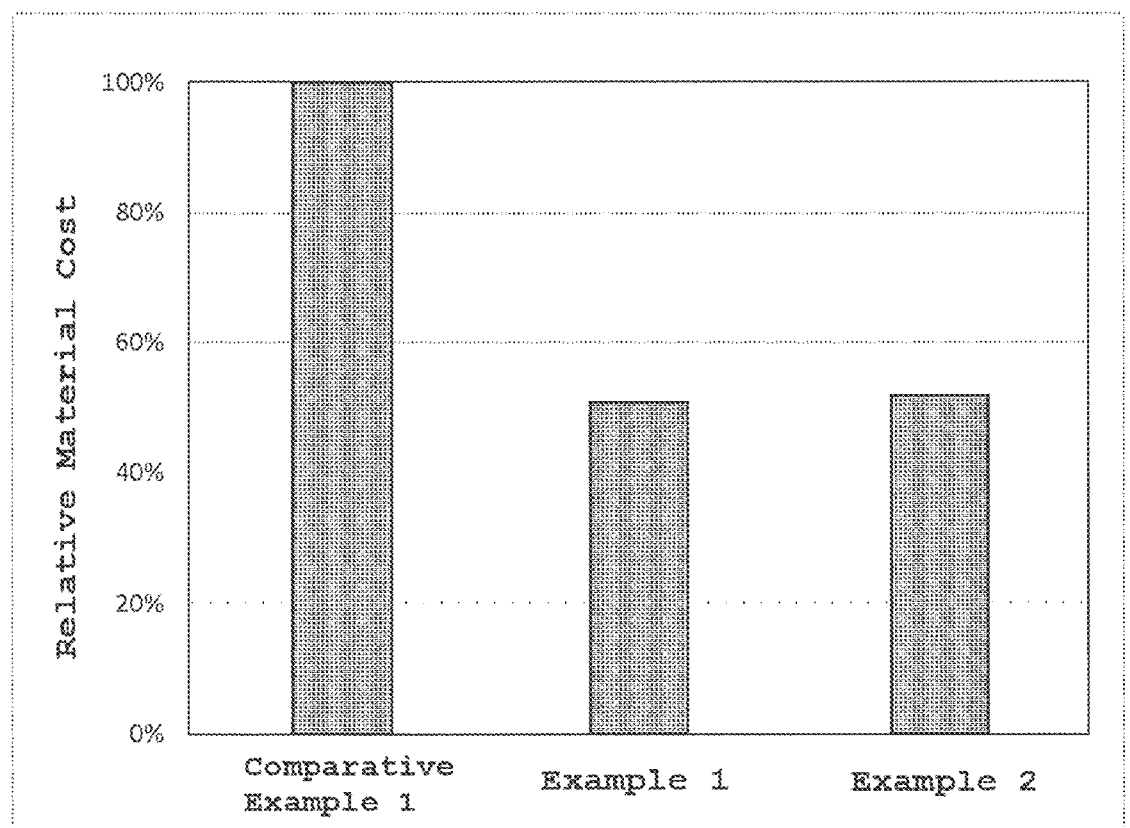

BONDED SEMICONDUCTOR LIGHT-RECEIVING DEVICE AND METHOD FOR MANUFACTURING BONDED SEMICONDUCTOR LIGHT-RECEIVING DEVICE

TECHNICAL FIELD

The present invention relates to a bonded semiconductor light-receiving device, and a method for manufacturing a bonded semiconductor light-receiving device.

BACKGROUND ART

Various bonded semiconductor devices have been proposed as novel functional substrates obtained by combining properties of a compound semiconductor with another functional substrate.

In an IoT sensor, a functional chip can be manufactured on a silicon substrate having a drive substrate by mounting: a photovoltaic cell (PV) as a passive power source; a photodiode (PD) as a signal receiver; and a laser diode (LD) or a light-emitting diode (LED) as a signal transmitter.

As the light-emitting diode, there have been proposed: an LED in which a light-emitting layer is bonded to a silicon substrate by metal bonding; or an LED in which a light-emitting layer is bonded to a transparent sapphire substrate with a transparent adhesive.

Any of the structures are characterized by being manufactured by bonding materials which are different from each other in physical properties, such as linear expansion coefficient and refractive index.

In the technique of bonding different types of materials, attention has been focused on the bonding material itself. After the bonding, the device needs to be packaged. In the packaging process or during operation after the packaging, the different types of materials undergo thermal hysteresis to some extent, so that the difference in physical properties sometimes causes failures.

The likely failures are delamination from the bonding surface and breakage at the portion of a compound semiconductor functional layer (device-functional layer), which is a thin portion.

When an encapsulation material is injected to perform packaging, the injection is performed with heating to a temperature of the softening point or higher in order to soften the encapsulation material. After the injection, the temperature of the encapsulation material is lowered to no higher than the softening point (generally room temperature), and the packaging is performed.

In the process of encapsulation material injection, each of the compound semiconductor portion as the device-functional layer portion, the bonding portion, and the support substrate portion as the supporting portion receives a similar temperature, and contracts according to its own physical properties when the temperature is lowered to room temperature. These portions have stresses due to the thermal contraction because the thermal expansion coefficients are not generally the same.

If the stress is excessively high, it can be detected as a failure immediately after the packaging. Meanwhile, in a case where no breakage occurs immediately after the packaging, the temperature inside the package increases and decreases by current flow and operation, so that delamination or breakage gradually proceeds. After a time elapses, delamination or breakage occurs, and the device fails to operate.

In cases of a single part, just one failure occurs. Meanwhile, if multiple functional sections are mounted on one chip, the entire chip is influenced, so that delamination or breakdown of one functional portion leads to breakdown of the entire system.

In addition, particularly devices using InP substrates are mechanically quite brittle, and the cost is very high. Stacking multiple types of layers on InP substrates enables formation of various functional layers, such as photovoltaic cells, light-emitting devices, and light-receiving devices. However, the mechanical brittleness hinders the devices from having large areas, and the high cost of the InP as the starting substrate has been one cause of very limited usage of InP-based devices.

For example, an InP-based light-receiving device can be obtained by producing a structure of a device-functional layer epitaxially grown on an InP substrate, and forming electrodes each having polarity opposite to each other. Since light-receiving devices are devices requiring area, the chip size needs to be increased to enhance the light-receiving sensitivity. However, when the chip size is increased, if the total chip thickness is smaller than the breadth, the mechanical strength is so low that the yield is decreased and the risk of sudden breakdown is increased.

Examples of the measure to avoid the above problems include increasing the thickness of an InP substrate more than the thickness of a chip layer. This measure can increase the mechanical strength. Nevertheless, InP crystal is very expensive, and forming a thick InP substrate greatly increases the cost, so that the product cannot be used in terms of cost.

Bonding an InP substrate to another substrate (for example, Si) which is high in mechanical strength and inexpensive is also a conceivable measure. Nevertheless, InP and Si have different thermal expansion coefficients, and direct bonding requiring high-temperature bonding is difficult. Moreover, if the thickness of the bonded substrate is too large, this causes a problem in the device mounting, and additional works are required such as polishing work including film thickness adjustment. In such a process, there are problems that the InP substrate cannot withstand the processing pressure and the bonded substrate cracks. Due to these, it is difficult to implement this measure.

Furthermore, to avoid the above brittleness problem, when a method is selected in which a material different from a starting substrate is bonded as a support substrate, a transparent material with respect to incident light can be selected as the support substrate. Nevertheless, the difference in refractive index is generally large between the material constituting an epitaxial layer and the support substrate. Hence, the critical angle is lowered, bringing about a problem of increasing incident light with which total reflection occurs at the bonding interface. Consequently, there is also a problem that the light-receiving efficiency is low when a backside-illuminated light-receiving device is fabricated.

CITATION LIST

Patent Literature

Patent Document 1: JP H09-063951 A
Patent Document 2: JP 2001-102668 A
Patent Document 3: JP 2017-228569 A
Patent Document 4: JP 2006-210916 A

SUMMARY OF INVENTION

Technical Problem

As described above, there have been demands for the development of a light-receiving device having high mechanical strength.

The present invention has been made to solve the above-described problems. An object of the present invention is to provide: a bonded semiconductor light-receiving device capable of exhibiting excellent mechanical strength; and a manufacturing method enabling manufacturing of a bonded semiconductor light-receiving device having high mechanical strength.

Solution to Problem

To solve the problems, the present invention provides a bonded semiconductor light-receiving device comprising:
an epitaxial layer to serve as a device-functional layer; and
a support substrate made of a material different from that of the device-functional layer and bonded to the epitaxial layer via a bonding material layer,
wherein the device-functional layer has a bonding surface comprising an uneven pattern formed thereon.

In the inventive bonded semiconductor light-receiving device, such a concave-convex pattern is formed on a bonding interface that is the bonding surface of the device-functional layer. Moreover, the device-functional layer is bonded to the support substrate with the bonding material layer interposed therebetween. These make it possible to exhibit enhanced bonding force between the support substrate and the epitaxial layer functioning as a device-functional layer. Thus, the inventive bonded semiconductor light-receiving device is capable of preventing delamination and breakage, which would be otherwise caused by temperature increase and decrease, of the device-functional layer and the support substrate made of different materials from each other. Consequently, excellent mechanical strength is successfully exhibited.

In addition, the presence of the uneven pattern formed on the bonding surface makes it possible to suppress incident light which would otherwise result in total reflection on the bonding interface. Thus, a decrease in light-receiving efficiency is successfully suppressed in a backside-illuminated light-receiving device.

Optionally, the device-functional layer can comprise at least one layer made of $In_x(Ga_yAl_{1-y})_{1-x}As$ (0.45≤x≤50.6, 0≤y≤1), and
the layer made of $In_x(Ga_yAl_{1-y})_{1-x}As$ can have a thickness of 0.1 μm or more.

Optionally, the device-functional layer can comprise at least one layer made of InP, and
the layer made of InP can have a thickness of 0.1 μm or more.

As described above, the device-functional layer can include various layers.

Preferably, the support substrate comprises at least one material selected from the group consisting of AlN, $Al_2O_3$, Cu, GaAs, GaN, GaP, InP, Si, SiC, and $SiO_2$, and
the material has a crystal or amorphous structure.

The support substrate containing the above material(s) enables the bonded semiconductor light-receiving device to exhibit more excellent mechanical strength.

The bonding material layer preferably comprises at least one selected from the group consisting of benzocyclobutene (BCB), polyimide (PI), low-melting-point glass, and porous silicon oxide.

Alternatively, the bonding material layer preferably comprises at least one metal selected from the group consisting of Au, Ag, Al, Ga, In, Ni, Pt and Ti.

The bonded semiconductor light-receiving devices including these bonding material layers can exhibit higher bonding force between the device-functional layer and the support substrate, and consequently exhibit more excellent mechanical strength.

Moreover, the present invention provides a method for manufacturing a bonded semiconductor light-receiving device, comprising steps of:
epitaxially growing a device-functional layer on a starting substrate;
providing an uneven pattern on a surface of the device-functional layer; and
bonding a support substrate to the device-functional layer via a bonding material layer.

In the inventive method for manufacturing a bonded semiconductor light-receiving device, a concave-convex pattern is formed on a bonding interface which is a bonding surface of the device-functional layer, and the device-functional layer is bonded to the support substrate with a bonding material layer interposed therebetween. These make it possible to enhance the bonding force between the support substrate and the epitaxial layer functioning as a device-functional layer. Thus, the inventive method for manufacturing a bonded semiconductor light-receiving device makes it possible to prevent delamination and breakage, which would be otherwise caused for example by temperature increase and decrease, of the device-functional layer and the support substrate made of different materials from each other. Consequently, a bonded semiconductor light-receiving device capable of exhibiting excellent mechanical strength is successfully manufactured.

Moreover, forming the uneven pattern on the bonding surface makes it possible to suppress incident light which would otherwise result in total reflection on the bonding interface. Thus, when a backside-illuminated light-receiving device is to be fabricated, a decrease in light-receiving efficiency is successfully suppressed.

Optionally, as the device-functional layer, a product comprising at least one layer made of $In_x(Ga_yAl_{1-y})_{1-x}As$ (0.4≤x≤0.6, 0≤y≤1) may be epitaxially grown, and
the layer made of $In_x(Ga_yAl_{1-y})_{1-x}As$ may have a thickness of 0.1 μm or more.

Optionally, as the device-functional layer, a product comprising at least one layer made of InP is epitaxially grown, and
the layer made of InP has a thickness of 0.1 μm or more.

The device-functional layer having various layers can be epitaxially grown as described above.

Preferably, the support substrate to be used comprises at least one material selected from the group consisting of AlN, $Al_2O_3$, Cu, GaAs, GaN, GaP, InP, Si, SiC, and $SiO_2$, and
the material has a crystal or amorphous structure.

The use of the support substrate containing such material(s) enables manufacturing of a bonded semiconductor light-receiving device capable of exhibiting more excellent mechanical strength.

The bonding material layer to be used preferably comprises at least one selected from the group consisting of benzocyclobutene (BCB), polyimide (PI), low-melting-point glass, and porous silicon oxide.

Alternatively, the bonding material layer to be used preferably comprises at least one metal selected from the group consisting of Au, Ag, Al, Ga, In, Ni, Pt and Ti.

The use of these bonding material layers can further enhance the bonding force between the device-functional layer and the support substrate, and consequently enables manufacturing of a bonded semiconductor light-receiving device capable of exhibiting more excellent mechanical strength.

Preferably, the inventive method further comprises, before the device-functional layer is formed, a step of forming a sacrificial layer on the starting substrate,
- further comprises, between the step of providing an uneven pattern and the bonding step, steps of:
  - forming a trench in the device-functional layer along a device-planned area;
  - forming an etching-protection film on the surface of the device-functional layer and on a surface of the trench; and
  - forming an opening in the etching-protection film at a bottom portion of the trench to expose a portion of the sacrificial layer, and
- further comprises, after the bonding step, a step of selectively etching the sacrificial layer to separate the starting substrate from the device-functional layer.

In this way, the starting substrate can be used repeatedly. This consequently enables cost reduction for manufacturing bonded semiconductor light-receiving devices.

Advantageous Effects of Invention

As described above, the inventive bonded semiconductor light-receiving device is capable of exhibiting excellent bonding strength between the support substrate and the epitaxial layer that is to be a device-functional layer. This makes it possible to prevent delamination and breakage of the device-functional layer and the support substrate made of different materials from each other, which would be otherwise caused by temperature increase and decrease, for example. As a result, the inventive bonded semiconductor light-receiving device is capable of exhibiting excellent mechanical strength.

In addition, the inventive method for manufacturing a bonded semiconductor light-receiving device makes it possible to enhance the bonding force between a support substrate and an epitaxial layer that is to be a device-functional layer. This enables manufacturing of a bonded semiconductor light-receiving device capable of preventing delamination and breakage of the device-functional layer and the support substrate made of different materials from each other, which would otherwise occur due to temperature increase and decrease, for example. As a result, the inventive method for manufacturing a bonded semiconductor light-receiving device enables manufacturing of a bonded semiconductor light-receiving device capable of exhibiting excellent mechanical strength.

BRIEF DESCRIPTION OF DRAWINGS

FIG. 1 is a schematic sectional view showing an example of a bonded semiconductor light-receiving device of the present invention.

FIG. 2 is a schematic sectional view for illustrating one step of a method for manufacturing a bonded semiconductor device according to a first embodiment of the present invention.

FIG. 3 is a schematic sectional view for illustrating one step of the method for manufacturing a bonded semiconductor device according to the first embodiment of the present invention.

FIG. 4 is a schematic sectional view for illustrating one step of the method for manufacturing a bonded semiconductor device according to the first embodiment of the present invention.

FIG. 5 is a schematic sectional view for illustrating one step of the method for manufacturing a bonded semiconductor device according to the first embodiment of the present invention.

FIG. 6 is a schematic sectional view for illustrating one step of the method for manufacturing a bonded semiconductor device according to the first embodiment of the present invention.

FIG. 7 is a schematic sectional view for illustrating one step of the method for manufacturing a bonded semiconductor device according to the first embodiment of the present invention.

FIG. 8 is a schematic sectional view for illustrating one step of the method for manufacturing a bonded semiconductor device according to the first embodiment of the present invention.

FIG. 9 is a schematic sectional view for illustrating one step of the method for manufacturing a bonded semiconductor device according to the first embodiment of the present invention.

FIG. 10 is a schematic sectional view for illustrating one step of the method for manufacturing a bonded semiconductor device according to the first embodiment of the present invention.

FIG. 11 is a schematic sectional view for illustrating one step of the method for manufacturing a bonded semiconductor device according to the first embodiment of the present invention.

FIG. 12 is a schematic sectional view for illustrating one step of the method for manufacturing a bonded semiconductor device according to the first embodiment of the present invention.

FIG. 13 is a schematic sectional view for illustrating one step of the method for manufacturing a bonded semiconductor device according to the first embodiment of the present invention.

FIG. 14 is a schematic sectional view for illustrating one step of the method for manufacturing a bonded semiconductor device according to the first embodiment of the present invention.

FIG. 15 is a schematic sectional view for illustrating one step of a method for manufacturing a bonded semiconductor device according to a second embodiment of the present invention.

FIG. 16 is a schematic sectional view for illustrating one step of the method for manufacturing a bonded semiconductor device according to the second embodiment of the present invention.

FIG. 17 is a schematic sectional view for illustrating one step of the method for manufacturing a bonded semiconductor device according to the second embodiment of the present invention.

FIG. 18 is a schematic sectional view for illustrating one step of the method for manufacturing a bonded semiconductor device according to the second as shown in FIG. 18, on the surface of FIG. 19 is a schematic sectional view for illustrating one step of the method for manufacturing a bonded semiconductor device according to the second embodiment of the present invention.

FIG. 20 is a schematic sectional view for illustrating one step of the method for manufacturing a bonded semiconductor device according to the second embodiment of the present invention.

FIG. 21 is a schematic sectional view for illustrating one step of the method for manufacturing a bonded semiconductor device according to the second embodiment of the present invention.

FIG. 22 is a schematic sectional view for illustrating one step of the method for manufacturing a bonded semiconductor device according to the second embodiment of the present invention.

FIG. 23 is a schematic sectional view for illustrating one step of the method for manufacturing a bonded semiconductor device according to the second embodiment of the present invention.

FIG. 24 is a schematic sectional view for illustrating one step of the method for manufacturing a bonded semiconductor device according to the second embodiment of the present invention.

FIG. 25 is a schematic sectional view for illustrating one step of the method for manufacturing a bonded semiconductor device according to the second embodiment of the present invention.

FIG. 26 is a schematic sectional view for illustrating one step of the method for manufacturing a bonded semiconductor device according to the second embodiment of the present invention.

FIG. 27 is a schematic sectional view for illustrating one step of the method for manufacturing a bonded semiconductor device according to the second embodiment of the present invention.

FIG. 28 is a graph showing failure rates of Comparative Example 2, Example 1, and Example 2.

FIG. 29 is a graph showing relative material costs of Examples 1 and 2 with the material cost of Comparative Example 1 being taken as 100%.

DESCRIPTION OF EMBODIMENTS

As noted above, there have been demands for the development of a light-receiving device high in mechanical strength.

The present inventor and colleagues have earnestly studied the above problems and consequently found that the bonding force between a support substrate and an epitaxial layer to serve as a device-functional layer can be enhanced by: forming an uneven pattern on a bonding interface, i.e., the bonding surface of the device-functional layer; and bonding the device-functional layer to the support substrate via a bonding material layer. This finding has led to the completion of the present invention.

Specifically, the present invention relates to a bonded semiconductor light-receiving device comprising:
  an epitaxial layer to serve as a device-functional layer; and
  a support substrate made of a material different from that of the device-functional layer and bonded to the epitaxial layer via a bonding material layer,
  wherein the device-functional layer has a bonding surface comprising an uneven pattern formed thereon Moreover, the present invention relates to a method for manufacturing a bonded semiconductor light-receiving device, the method comprising steps of:
  epitaxially growing a device-functional layer on a starting substrate;
  providing an uneven pattern on a surface of the device-functional layer; and
  bonding a support substrate to the device-functional layer via a bonding material layer.

Note that Patent Document 1 discloses a method in which a compound semiconductor is bonded to a Si substrate. However, in this method, the compound semiconductor and the Si substrate are directly bonded.

Moreover, Patent Document 2 discloses a method in which after layers obtained by epitaxial growth are bonded to each other, an $Al_yGa_{1-y}As$ layer provided below one of the layers is etched, and the epitaxial layers and a starting substrate are separated. However, in Patent Document 2, the epitaxial layers and a silicon substrate serving as a support substrate are directly bonded.

Further, Patent Document 3 discloses an avalanche photodiode in which a substrate having heat-sink function is bonded to an avalanche photodiode (APD) mesa via an adhesive layer. However, this reference document 3 fails to disclose that convex and concave are formed on the bonding surface of the APD mesa.

Furthermore, Patent Document 4 discloses a light-emitting device including a transparent substrate and a light emitting stack which are bonded with a transparent adhesive layer, for example, benzocyclobutene (BCB) or the like, interposed therebetween. The bonding portion has, for example, a rough surface with convex-concave or micro protrusions, such as pyramid shape. However, Patent Document 4 describes a light-emitting devices but not a light-receiving device.

Hereinafter, the present invention will be described in detail with reference to the drawings, but the present invention is not limited thereto.

[Bonded Semiconductor Light-Receiving Device]

The inventive bonded semiconductor light-receiving device is characterized as follows. The bonded semiconductor light-receiving device includes: an epitaxial layer to serve as a device-functional layer; and a support substrate made of a material different from that of the device-functional layer and bonded to the epitaxial layer via a bonding material layer. The device-functional layer has a bonding surface with an uneven pattern formed thereon.

Thus, an uneven pattern formed on the bonding surface of the device-functional layer, which is the bonding interface, and the bonding of the device-functional layer and the support substrate with the bonding material layer interposed therebetween make it possible to exhibit enhanced bonding force between the support substrate and the epitaxial layer to serve as the device-functional layer. Accordingly, the inventive bonded semiconductor light-receiving device is capable of preventing delamination and breakage of the device-functional layer and the support substrate made of materials different from each other, which would be otherwise caused by temperature increase and decrease, for example. As a result, it is possible to exhibit excellent mechanical strength.

Moreover, the presence of the uneven pattern formed on the bonding surface enables suppression of incident light which would otherwise result in total reflection at the bonding interface. Accordingly, when a backside-illuminated light-receiving device is prepared, a decrease in light-receiving efficiency can be suppressed.

The shape of the uneven pattern is not particularly limited. The uneven pattern has a step of preferably 0.01 μm or more and 5.0 μm or less, more preferably 0.1 μm or more and 1.0 μm or less. Additionally, the uneven pattern preferably accounts for 10% or more and 100% or less, more preferably accounts for 80% or more and 100% or less, of the bonding surface of the device-functional layer.

The device-functional layer can include at least one layer made of $In_x(Ga_yAl_{1-y})_{1-x}As$ ($0.4 \leq x \leq 0.6$, $0 \leq y \leq 1$), and the layer made of $In_x(Ga_yAl_{1-y})_{1-x}As$ may have a thickness of 0.1 μm or more. The upper limits of the number and thickness of the layer made of $In_x(Ga_yAl_{1-y})_{1-x}As$ are not particularly limited. For example, the device-functional layer can include 14 or fewer layers made of $In_x(Ga_yAl_{1-y})_{1-x}As$. The thickness of each layer made of $In_x(Ga_yAl_{1-y})_{1-x}As$ can be, for example, 5 μm or less. The device-functional layer can also include at least one layer made of InP, and the layer made of InP may have a thickness of 0.1 μm or more. The upper limits of the number and thickness of the layer made of InP are not particularly limited. For example, the device-functional layer can include 14 or fewer layers made of InP. The thickness of each layer made of InP can be, for example, 5 μm or less.

Thus, the device-functional layer can include various layers.

Preferably, the support substrate contains at least one material selected from the group consisting of AlN, $Al_2O_3$, Cu, GaAs, GaN, GaP, InP, Si, SiC, and $SiO_2$, and the material has a crystal or amorphous structure.

The support substrate containing the above material(s) enables the bonded semiconductor light-receiving device to exhibit more excellent mechanical strength.

The bonding material layer preferably contains at least one selected from the group consisting of benzocyclobutene (BCB), polyimide (PI), low-melting-point glass, and porous silicon oxide.

Alternatively, the bonding material layer preferably contains at least one metal selected from the group consisting of Au, Ag, Al, Ga, In, Ni, Pt and Ti.

The bonded semiconductor light-receiving device incorporating such bonding material layers can exhibit further enhanced bonding force between the device-functional layer and the support substrate. Consequently, more excellent mechanical strength is successfully exhibited.

Next, an example of the inventive bonded semiconductor light-receiving device will be described with reference to FIG. 1.

A bonded semiconductor light-receiving device 100 shown in FIG. 1 includes: an epitaxial layer 10 to serve as a device-functional layer; a support substrate 30; and a bonding material layer 20. The device-functional layer 10 is bonded to the support substrate 30 via the bonding material layer 20.

An uneven pattern 10B is formed on a bonding surface 10A of the device-functional layer 10 relative to the support substrate 30.

[Method for Manufacturing Bonded Semiconductor Light-Receiving Device]

The inventive method for manufacturing a bonded semiconductor light-receiving device is characterized by including steps of:

provides epitaxially growing a device-functional layer on a starting substrate;

providing an uneven pattern on a surface of the device-functional layer; and bonding a support substrate to the device-functional layer via a bonding material layer.

In the inventive method for manufacturing a bonded semiconductor light-receiving device, an uneven pattern is formed on the bonding surface of the device-functional layer, which is the bonding interface, and the device-functional layer and the support substrate are bonded with a bonding material layer interposed therebetween. These make it possible to enhance bonding force between the support substrate and the epitaxial layer to serve as the device-functional layer. Accordingly, the inventive method for manufacturing a bonded semiconductor light-receiving device makes it possible to prevent delamination and breakage of the device-functional layer and the support substrate made of materials different from each other, which would be otherwise caused by temperature increase and decrease, for example. As a result, a bonded semiconductor light-receiving device capable of exhibiting excellent mechanical strength can be manufactured.

Moreover, forming the uneven pattern on the bonding surface enables suppression of incident light which would otherwise result in total reflection at the bonding interface. Accordingly, when a backside-illuminated light-receiving device to be produced, a decrease in light-receiving efficiency can be suppressed.

According to the inventive method for manufacturing a bonded semiconductor light-receiving device, the inventive bonded semiconductor light-receiving device can be manufactured.

The method of forming the uneven pattern is not particularly limited. For example, the uneven pattern may be formed by drawing a pattern as a periodic pattern according to a photolithography method, or an uneven surface may be formed as a result of roughening treatment by wet etching. The uneven pattern has a step of preferably 0.01 μm or more and 5.0 μm or less, more preferably 0.1 μm or more and 1.0 μm or less. In addition, the uneven pattern is preferably formed to account for 10% or more and 100% or less of the bonding surface of the device-functional layer, more preferably formed to account for 80% or more and 100% or less.

The epitaxially-grown device-functional layer can include at least one layer made of $In_x(Ga_yAl_{1-y})_{1-x}As$ ($0.4 \leq x \leq 0.6$, $0 \leq y \leq 1$), and the layer made of $In_x(Ga_yAl_{1-y})_{1-x}As$ may have a thickness of 0.1 μm or more.

The epitaxially-grown device-functional layer can also include at least one layer made of InP, and the layer made of InP may have a thickness of 0.1 μm or more.

Thus, the device-functional layer having various layers can be epitaxially grown.

The support substrate to be used preferably contains at least one material selected from the group consisting of AlN, $Al_2O_3$, Cu, GaAs, GaN, GaP, InP, Si, SiC, and $SiO_2$, and the material has a crystal or amorphous structure.

The use of the support substrate containing such a material(s) enables manufacturing of a bonded semiconductor light-receiving device capable of exhibiting more excellent mechanical strength.

The bonding material layer to be used preferably contains at least one selected from the group consisting of benzocyclobutene (BCB), polyimide (PI), low-melting-point glass, and porous silicon oxide.

Alternatively, the bonding material layer to be used preferably contains at least one metal selected from the group consisting of Au, Ag, Al, Ga, In, Ni, Pt and Ti.

The use of these bonding material layers can further enhance the bonding force between the device-functional layer and the support substrate. As a result, it is possible to manufacture a bonded semiconductor light-receiving device capable of exhibiting more excellent mechanical strength.

Preferably, the inventive method further includes, before the device-functional layer is formed, a step of forming a sacrificial layer on the starting substrate, further includes, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and further includes, after the bonding step, a step of selectively etching the sacrificial layer to separate the starting substrate from the device-functional layer.

In this way, the starting substrate can be used repeatedly. Consequently, the manufacturing cost of bonded semiconductor light-receiving devices can be reduced.

The step of forming a sacrificial layer, the step of forming a trench, the step of forming an etching-protection film, the step of forming an opening in the etching-protection film at a bottom portion of the trench, and the step of selectively etching the sacrificial layer are not particularly limited. Examples of each of these steps will be described in the following first and the second embodiments.

Next, some embodiments of the inventive bonded semiconductor light-receiving device and method for manufacturing a bonded semiconductor light-receiving device will be described in detail with reference to the drawings.

First Embodiment

First, as a first embodiment, an example of the inventive bonded semiconductor light-receiving device, and an example of a manufacturing method therefor will be described with reference to FIGS. 2 to 14.

First, by the following procedure, an epitaxial wafer 200 shown in FIG. 2 is provided, in which a sacrificial layer 3 is disposed between a starting substrate 1 and a device-functional layer 10, and the device-functional layer 10 has a light-receiving device (PD) structure.

The device-functional layer 10 formed on a semi-insulating InP substrate 1 as an example of the starting substrate 1 is epitaxially grown according to the following sequence. On the semi-insulating InP starting substrate 1, an i-InP buffer layer 2 having a thickness of for example 0.5 μm is formed, and an i-In$_x$Ga$_{1-x}$As (0.4≤x≤0.6) sacrificial layer (hereinafter, i-InGaAs sacrificial layer) 3 having a thickness of for example 0.3 μm is formed. Then, on the i-InGaAs sacrificial layer 3, an i-InP etch stop layer 4 having a thickness of for example 0.3 μm, an i-In$_x$Ga$_{1-x}$As (0.4≤x≤0.6) contact layer (hereinafter, InGaAs contact layer) 11 having a thickness of for example 0.1 μm, an i-InP cap layer 12 having a thickness of for example 0.1 μm, an i-In$_x$Ga$_{1-x}$As (0.4≤x≤0.6) absorption layer (hereinafter, InGaAs absorption layer) 13 having a thickness of for example 3.0 μm, and an n-InP layer 14 having a thickness of for example 1.0 μm are sequentially formed by epitaxial growth. Thus, the epitaxial wafer 200 is provided.

Next, on the n-InP layer 14 located at a surface 10A of the epitaxial wafer 200 (bonding surface 10A of the device-functional layer 10), an uneven pattern 10B is formed as shown in FIG. 3. The uneven pattern 10B may be formed by drawing a pattern as a periodic pattern according to a photolithography method, or an uneven surface may be formed as a result of roughening treatment by wet etching.

Next, as shown in FIG. 4, a trench 5 is formed in the device-functional layer 10 along the size of a device-planned area 10C. The trench 5 can be formed by any method of wet etching and dry etching.

In the wet etching, the trench 5 can be formed by the following procedure, for example. First, a resist pattern is formed on the bonding surface 10A of the device-functional layer 10 by a photolithography method. Based on the formed resist pattern, the n-InP layer 14 is selectively etched with a chlorine-based etchant. After the selective etching of the n-InP layer 14, the etchant is switched to a sulfuric acid-hydrogen peroxide mixture-based etchant, and the i-InGaAs absorption layer 13 is selectively etched. Then, the etchant is switched to a chlorine-based etchant, and the i-InP cap layer 12 is selectively etched. Subsequently, the etchant is switched to a sulfuric acid-hydrogen peroxide mixture-based etchant, and the i-InGaAs contact layer 11 is selectively etched. Thereafter, the etchant is switched to a chlorine-based etchant, and the i-InP etching stop layer 4 is selectively etched. Through the above steps, the trench 5 can be formed in which the i-InGaAs sacrificial layer 3 is exposed at a trench bottom portion 5A.

Meanwhile, in the dry etching, the etching is possible by gas etching in an atmosphere in which a chlorine-based gas such as Cl$_2$ is mixed with a plasma stabilization gas such as Ar. When dry etching is selected, the advantage includes that no convex-concave shape is formed on the sidewall of the trench 5. Nevertheless, since the etching selectivity thereof is low, it is difficult to automatically stop the etching at the i-InGaAs sacrificial layer 3. Hence, the i-InGaAs sacrificial layer 3 needs to have a thickness larger than that in the wet etching, and it is suitable to prepare the sacrificial layer of 0.3 μm or more.

Next, as shown in FIG. 5, an etching-protection film 6 is formed on the entire surface of the device-functional layer 10 including the trench portion 5. In other words, the etching-protection film 6 is formed on the surface of the device-functional layer 10 and on a surface of the trench 5. For the formation of the etching-protection film 6, any method that can form a protection film can be selected, such as sol-gel method, dipping method, RF-EB, sputtering, and CVD. For example, the SiO$_2$ etching-protection film 6 having a thickness of for example 0.3 μm can be formed by employing a p-CVD method using a material system combining TEOS and O$_2$.

Next, by a photolithography method, a resist pattern as a resist mask is formed on a surface of a portion 6A of the etching-protection film 6, the portion 6A being formed on the bottom portion 5A of the trench 5. And then, as shown in FIG. 6, an opening pattern 6B is formed in the bottom portion of the trench 5 by utilizing the resist mask.

For the etching to form the opening pattern 6B, for example, a hydrofluoric acid-based etchant can be used. Nevertheless, the opening etching is not limited to wet etching. In dry etching, similar result can be obtained by using fluorine-based gases (such as NF$_3$, SF$_6$).

Next, as shown in FIG. 7, for example, a Si substrate is provided as a support substrate 30, which is a substrate to be bonded. The surface of the Si substrate 30 is coated with, for example, benzocyclobutene (BCB) as a bonding material. Thereby, a bonding material layer 20 is formed.

The support substrate 30 is not limited to a Si substrate. One containing, for example, at least one material selected from the group consisting of AlN, Al$_2$O$_3$, Cu, GaAs, GaN, GaP, InP, Si, SiC, and SiO$_2$ can be used, and the material may have a crystal or amorphous structure. These materials are preferable because the materials are superior in mechanical strength to InP substrate.

The bonding material can also be selected from any of, for example, polyimide (PI), low-melting-point glass, and porous silicon oxide, besides BCB.

The bonding material layer 20 may have a thickness of, for example, 1.0 µm. The layer thickness is not limited thereto. Any layer thickness can be selected, as long as the layer thickness does not cause trouble in performing the steps. If the bonding pressure in the following step is 50 N/cm² or less, a small amount of BCB serving as the bonding material layer 20 oozes out into the trench 5 layer due to the compression-bonding pressure during the bonding, so that the thickness of the BCB-coating layer can exceed 1.0 µm.

As the bonding material layer 20, any thin film can be selected if the bonding is possible. Preferably, the layer is formed to have a thickness higher than the step of the uneven pattern 10B.

Next, as shown in FIG. 8, the support substrate 30 and the epitaxial wafer 200 are bonded by thermocompression bonding with the bonding material layer 20 interposed therebetween. Thus, a bonded wafer 300 is formed. The bonding-curing temperature is preferably 250° C. or more. Moreover, the bonding pressure is preferably 50 N/cm² or more. These conditions are suitable conditions for obtaining sufficient bonding strength, but the temperature and pressure are not limited thereto.

Next, the bonded wafer 300 is immersed in sulfuric acid-hydrogen peroxide mixture-based etchant. The i-InGaAs sacrificial layer 3 is sandwiched between the i-InP buffer layer 2 and the i-InP etch stop layer 4. The sulfuric acid-hydrogen peroxide mixture has an etching selectivity with respect to InP (InP is not etched), and only the i-InGaAs sacrificial layer 3 is etched, so that the InP starting substrate 1 is separated from the device-functional layer 10 as shown in FIG. 9. After the separation as shown in FIG. 9, an island pattern with the isolated device-functional layer 10 is left on the support substrate 30. Note that the i-InGaAs contact layer 11 and the i-InGaAs absorption layer 13 are protected by the i-InP etch stop layer 4 and the etching-protection film 6 and are not etched.

Next, the i-InP etch stop layer 4 is selectively etched with a chlorine-based etchant in the manner described above. Since the i-InP etch stop layer 4 is removed, the etching-protection layer 6 is formed to partially stick out from the surface, which is likely detached in the subsequent step and thereafter and causes the yield reduction. For these reasons, such sticking-out portions are partially detached with water stream or the like. After the detachment, the i-InGaAs contact layer 11 is partially exposed as shown in FIG. 10. Then, Zn is diffused into the surface of the device-functional layer 10, so that a p-type layer is formed in the surface.

Next, the device-functional layer 10 is partially cut away by wet etching as described above, and the n-InP layer 14 is partially exposed as shown in FIG. 11. The step of exposing the n-InP layer 14 can be performed by the same method as in the trench formation step. After the cutting-away step, the etching-protection layer 6 protrudes. Since these sticking-out portions are likely detached in the subsequent step and thereafter and causes the yield reduction, the sticking-out portions are partially detached with water stream or the like.

Next, a protection film 15 is formed on the surface of the device-functional layer 10. To form the protection film 15, the same step for forming the etching-protection film 6 on the trench 5 is applicable. Subsequently, as shown in FIG. 12, openings 15A and 15B for electrode formation are formed in sections of the formed protection film 15 by the same procedure described above. A portion of the i-InGaAs contact layer 11 is exposed through the opening 15A, and a portion of the n-InP layer 14 is exposed through the opening 15B.

Next, electrodes 16 and 17 are formed through the openings 15A and 15B as shown in FIG. 13. After the electrodes 16 and 17 are formed, the i-InGaAs contact layer 11 is partially removed by the wet etching method as described above, and an aperture portion 11A is formed as shown in FIG. 13. After the aperture portion 11A is formed, a protection layer made of $SiN_x$ (0<x≤2) or the like is formed, portions corresponding to the electrodes and to dicing section are removed therefrom.

After the $SiN_x$ protection layer pattern is formed, the bonded wafer 300 is separated into individual devices as shown in FIG. 14 by dicing or scribing/breaking method. Thereby, light-receiving devices 100 are formed.

Thus, a bonded semiconductor passive device according to the first embodiment shown in FIG. 14 is obtained in which the epitaxial layer functioning as the device-functional layer 10 is bonded to the support substrate 30 via the bonding material layer 20, and the uneven pattern 10B is formed on the bonding surface 10A of the device-functional layer 10.

Second Embodiment

Next, as a second embodiment, another example of the inventive bonded semiconductor light-receiving device, and an example of a manufacturing method therefor will be described with reference to FIGS. 15 to 27.

First, an epitaxial wafer 200 shown in FIG. 15 is provided as follows, in which a sacrificial layer 3 is disposed between a starting substrate 1 and a device-functional layer 10, and the device-functional layer 10 has a light-receiving device (PD) structure.

The device-functional layer 10 formed on a semi-insulating InP starting substrate 1 as an example of the starting substrate 1 is epitaxially grown according to the following sequence. First, on the semi-insulating InP starting substrate 1, an i-InP buffer layer 2 having a thickness of for example 0.5 µm is formed. Next, an $i-In_xGa_{1-x}As$ (0.4≤x≤0.6) sacrificial layer (hereinafter, i-InGaAs sacrificial layer) 3 having a thickness of for example 0.3 µm is formed. Then, on the i-InGaAs sacrificial layer 3, an i-InP etch stop layer 4 having a thickness of for example 0.3 µm, an $i-In_xGa_{1-x}As$ (0.4≤x≤0.6) contact layer (hereinafter, i-InGaAs contact layer) 11 having a thickness of for example 0.1 µm, an i-InP cap layer 12 having a thickness of for example 0.1 µm, an $i-In_xGa_{1-x}As$ (0.4≤x≤0.6) absorption layer (hereinafter, i-InGaAs absorption layer) 13 having a thickness of for example 3.0 µm, and an n-InP layer 14 having a thickness of for example 1.0 µm are sequentially formed by epitaxial growth. Thus, the epitaxial wafer 200 is prepared.

Next, on the n-InP layer 14 located at a surface 10A of the epitaxial wafer 200 (bonding surface 10A of the device-functional layer 10), an uneven pattern 10B is formed as shown in FIG. 16. The uneven pattern 10B may be formed by drawing a pattern as a periodic pattern by a photolithography method, or an uneven surface may be formed as a result of roughening treatment by wet etching.

Next, as shown in FIG. 17, a trench 5 is formed in the device-functional layer 10 along the size of a device-planned area 10C. The trench 5 can be formed by any method of wet etching and dry etching.

In the wet etching, the trench 5 can be formed by the following procedure, for example. First, a resist pattern is formed on the bonding surface 10A of the device-functional layer 10 by a photolithography method. Based on the formed resist pattern, the n-InP layer 14 is selectively etched with a chlorine-based etchant. After the selective etching of the n-InP layer 14, the etchant is switched to a sulfuric acid-hydrogen peroxide mixture-based etchant, and the i-InGaAs absorption layer 13 is selectively etched. Then, the etchant is switched to a chlorine-based etchant, and the i-InP cap layer 12 is selectively etched. Subsequently, the etchant is switched to a sulfuric acid-hydrogen peroxide mixture-based etchant, and the i-InGaAs contact layer 11 is selectively etched. Thereafter, the etchant is switched to a chlorine-based etchant, and the i-InP etching stop layer 4 is selectively etched. Through the above steps, the trench 5 can be formed in which the i-InGaAs sacrificial layer 3 is exposed at a trench bottom portion 5A.

Meanwhile, in the dry etching, the etching is possible by gas etching in an atmosphere in which a chlorine-based gas such as $Cl_2$ is mixed with a plasma stabilization gas such as Ar. When dry etching is selected, the advantage includes that no convex-concave shape is formed on the sidewall of the trench 5. Nevertheless, since the etching selectivity thereof is low, it is difficult to automatically stop the etching at the i-InGaAs sacrificial layer 3. Hence, the i-InGaAs sacrificial layer 3 needs to have a thickness larger than that in the wet etching, and it is suitable to prepare the sacrificial layer of 0.3 μm or more.

Next, as shown in FIG. 18, an etching-protection film 6 is formed on the entire surface of the device-functional layer 10 including the trench portion 5. In other words, the etching-protection film 6 is formed on the surface of the device-functional layer 10 and on a surface of the trench 5. For the formation of the etching-protection film 6, any method that can form a protection film can be selected, such as sol-gel method, dipping method, RF-EB, sputtering, and CVD. For example, the $SiO_2$ etching-protection film 6 having a thickness of for example 0.3 μm can be formed by employing a p-CVD method using a material system combining TEOS and $O_2$.

Next, by a photolithography method, a resist pattern is formed on a surface portion of a portion of the etching-protection film 6, the portion corresponding to the uneven pattern 10B. Openings are formed in such portions.

For the opening etching, a hydrofluoric acid-based etchant can be used. Nevertheless, the opening etching is not limited to wet etching. In dry etching, a fluorine-based gas (such as $NF_3$, $SF_6$) can be used.

Then, in the opening formed in the portions of the etching-protection film 6 on the uneven pattern 10B of the n-InP layer 14, a bonding metal layer 21 is vapor-deposited, which is then in contact with the n-InP layer 14 shown in FIG. 19. For example, the bonding metal layer 21 is formed in the opening by self-alignment process by which resist removal and electrode pattern formation are simultaneously performed.

In the bonding metal layer 21, for example, Pt may be disposed as a layer adjacent to the n-InP layer 14, and Au may be disposed at the bonding interface. As the material of the bonding metal layer 21, any combination can be selected, as long as the material system has a structure enabling bonding in the subsequent step and has resistance to an etching for the sacrificial layer in the later step. As the layer adjacent to the n-InP layer 14, Al or Ti can be selected besides Pt. For the bonding interface layer, Al, Ag, Ga, In, Ni, or the like can be selected besides Au. For example 0.1 μm of the Pt layer and for example 1 μm of the Au layer can be sequentially formed, as an example.

Next, by a photolithography method, a resist pattern as a resist mask is formed on a surface of a portion 6A of the etching-protection film 6, the portion 6A being formed on the bottom portion 5A of the trench 5. And then, as shown in FIG. 19, an opening pattern 6B is formed in the bottom portion of the trench 5 by utilizing the resist mask.

For the etching to form the opening pattern 6B, for example, a hydrofluoric acid-based etchant can be used. Nevertheless, the opening etching is not limited to wet etching. In dry etching, a fluorine-based gas (such as $NF_3$, $SF_6$) can be used.

Next, as shown in FIG. 20, for example, a Si substrate is provided as a support substrate 30, which is a substrate to be bonded. A bonding metal layer 22 is formed on a surface of the Si substrate 30.

The support substrate 30 is not limited to a Si substrate. One containing, for example, at least one material selected from the group consisting of AlN, $Al_2O_3$, Cu, GaAs, GaN, GaP, InP, Si, SiC, and $SiO_2$ can be used, and the material may have a crystal or amorphous structure. These materials are preferable because the materials are superior in mechanical strength to InP substrate.

It is possible to use the bonding metal layer 22 in which, for example, Pt is disposed as a layer adjacent to the Si substrate (support substrate) 30, and Au is disposed at the bonding interface. It is needless to say that, as the material of the bonding metal layer 22, any combination can be selected, as long as the material system has a structure enabling bonding in the subsequent step and has resistance to the etching for the sacrificial layer in the later step. For the layer adjacent to the Si substrate 30, Al or Ti can be selected besides Pt. As the bonding interface layer, Al, Ag, Ga, In, Ni, or the like can be selected besides Au. For example, 0.1 μm of the Pt layer and for example 1 μm of the Au layer can be sequentially formed as an example.

As the thicknesses of the bonding metal layers 21 and 22, any thickness can be selected if the bonding is possible. Preferably, the layers are formed to have thicknesses higher than the step of the uneven pattern 10B.

Next, as shown in FIG. 21, the support substrate 30 and the epitaxial wafer 200 are bonded by thermocompression bonding such that the bonding metal layers 21 and 22 abut each other. Thus, a bonded wafer 300 is formed. The bonding temperature is preferably 350° C. or more. Moreover, the bonding pressure is preferably 50 N/cm² or more. These conditions are suitable conditions for obtaining sufficient bonding strength, but the temperature and pressure are not limited thereto.

Next, the bonded wafer 300 is immersed in sulfuric acid-hydrogen peroxide mixture-based etchant. The i-InGaAs sacrificial layer 3 is sandwiched between the i-InP buffer layer 2 and the i-InP etch stop layer 4. The sulfuric acid-hydrogen peroxide mixture has an etching selectivity with respect to InP (InP is not etched). Therefore, only the i-InGaAs sacrificial layer 3 is etched, so that the InP starting substrate 1 is separated from the device-functional layer 10 as shown in FIG. 22. After the separation, as shown in FIG. 22, an island pattern with the isolated device-functional layer 10 is left on the support substrate 30. Note that the i-InGaAs contact layer 11 and the i-InGaAs absorption layer 13 are protected by the i-InP etch stop layer 4 and the etching-protection film 6, and therefore are not etched.

Next, the i-InP etch stop layer 4 is selectively etched with a chlorine-based etchant in the manner described above. Since the i-InP etch stop layer 4 is removed, the etching-protection layer 6 is formed to partially stick out from the surface, which is likely detached in the subsequent step and thereafter causes the yield reduction. For these reasons, such sticking-out portions are partially detached with water stream or the like. After the detachment, the i-InGaAs contact layer 11 is partially exposed as shown in FIG. 23.

After the i-InP etch stop layer 4 is removed, the SiO$_2$ film as the etching-protection layer 6 covering the sidewalls of the trench 5 is removed as shown in FIG. 24.

Then, the surface of the device-functional layer 10 is coated again with a SiO$_2$ film as a protection film 15. As shown in FIG. 25, an opening 15A is formed in a section of the protection film 15 by a photolithography method. Toward the opening 15A, Zn is diffused, and a p-type layer is formed at the surface of the opening 15A.

Then, as shown in FIG. 26, an electrode 16 is formed at sections of the opening 15A. After the electrode 16 is formed, the i-InGaAs contact layer 11 is partially removed by the wet etching method as described above, and an aperture portion 11A is formed as shown in FIG. 26. After the aperture portion 11A is formed, a protection layer made of SiN$_x$ (0<x≤2) or the like is formed, and portions corresponding to the electrode and to dicing section are removed therefrom.

After the SiN$_x$ protection layer pattern is formed, an electrode 40 shown in FIG. 26 is formed on the backside of the support substrate 30. Then, the bonded wafer 300 is separated into individual devices as shown in FIG. 27 by dicing or scribing/breaking method. Thereby, light-receiving devices 100 are formed.

Thus, a bonded semiconductor passive device according to the second embodiment shown in FIG. 27 is obtained in which the epitaxial layer functioning as the device-functional layer 10 is bonded to the support substrate 30 via the bonding material layer 20 constituted of the bonding metal layers 21 and 22, and the uneven pattern 10B is formed on the bonding surface 10A of the device-functional layer 10.

The i-InGaAs contact layer 11 and the i-InGaAs absorption layer 13 used in the first and second embodiments may contain Al and may be i-In$_x$(Ga$_y$Al$_{1-y}$)$_{1-x}$As (0.4≤x≤0.6, 0<y≤1) instead of i-In$_x$Ga$_{1-x}$As (0.4≤x≤0.6). Moreover, the i-InGaAs the sacrificial layer 3 used in the first and second embodiments may contain P and may be a layer made of i-In$_x$Ga$_{1-x}$As$_z$P$_{1-z}$ (0.4≤x≤0.6, 0.8≤z<1) instead of i-In$_x$Ga$_{1-x}$As (0.4≤x≤0.6).

EXAMPLES

Hereinafter, the present invention will be specifically described by way of Examples and Comparative Examples, but the present invention is not limited thereto.

Example 1

In Example 1, the bonded semiconductor light-receiving device 100 having the same structure shown in FIG. 14 was produced by the following procedure.

First, the device-functional layer (epi-functional layer) 10 was epitaxially grown and formed on the semi-insulating InP starting substrate 1 according to the following procedure. On the semi-insulating InP starting substrate 1, the i-InP buffer layer 2 having a thickness of 0.5 μm was formed, and the i-InGaAs sacrificial layer 3 having a thickness of 0.3 μm was formed thereon. Then, on the i-InGaAs sacrificial layer 3, the i-InP etch stop layer 4 having a thickness of 0.3 μm, the i-InGaAs contact layer 11 having a thickness of 0.1 μm, the i-InP cap layer 12 having a thickness of 0.1 μm, the i-InGaAs absorption layer 13 having a thickness of 3.0 μm, and the n-InP layer 14 having a thickness of 1.0 μm were sequentially formed by epitaxial growth. Thus, the same epitaxial wafer 200 as shown in FIG. 2 was provided.

Next, on the n-InP layer 14 located at the surface 10A of the epitaxial wafer 200, the uneven pattern 10B was formed as shown in FIG. 3 by wet etching.

Then, as shown in FIG. 4, along the size of the device-planned area 10C, the trench 5 was formed in the device-functional layer 10 by dry etching with Cl$_2$ gas.

Next, as shown in FIG. 5, on the surface of the device-functional layer 10 and on the surface of the trench 5, a 0.3-μm SiO$_2$ film was formed as the etching-protection film 6 by employing a p-CVD method using TEOS and O$_2$ in combination as the materials.

Next, by a photolithography method, a resist pattern as a resist mask was formed on the surface of the portion 6A of the etching-protection film 6, the portion 6A being formed on the bottom portion 5A of the trench 5. As shown in FIG. 6, the opening pattern 6B was formed with hydrofluoric acid in the bottom portion of the trench 5 by utilizing the resist mask.

Next, as shown in FIG. 7, a Si substrate was provided as the support substrate 30, which is a substrate to be bonded. BCB was applied as a bonding material having a thickness of 1.0 μm to the surface of the Si substrate 30 to form the bonding material layer 20.

Next, as shown in FIG. 8, the support substrate 30 and the epitaxial wafer 200 were bonded via the bonding material 20 by thermocompression bonding (heating and curing temperature: 270° C., pressure: 100 N/cm$^2$). Thereby, the bonded wafer 300 was formed.

Next, the bonded wafer 300 was immersed in a sulfuric acid-hydrogen peroxide mixture etchant to etch the i-InGaAs sacrificial layer 3. Thereby, the InP starting substrate 1 was separated from the device-functional layer 10 as shown in FIG. 9.

Next, the i-InP etch stop layer 4 was selectively etched with a chlorine-based etchant as described above. Sticking-out portions of the etching-protection film 6 were partially detached with water stream. Thereby, the bonded wafer 300 shown in FIG. 10 was obtained. After the detachment, Zn was diffused into the surface of the device-functional layer 10, and a p-type layer was formed at the surface.

Next, the device-functional layer 10 was partially cut away by wet etching as described above, and the n-InP layer 14 was partially exposed as shown in FIG. 11.

Next, the protection film 15 was formed on the surface of the device-functional layer 10. As shown in FIG. 12, the openings 15A and 15B for forming electrodes were formed in sections of the protection film 15. The i-InGaAs contact layer 11 was partially exposed through the opening 15A, and the n-InP layer 14 was partially exposed through the opening 15B.

Next, as shown in FIG. 13, the electrodes 16 and 17 were formed in the openings 15A and 15B. In each of the electrodes 16 and 17, a 0.1-μm Ti layer and a 1.0-μm Au layer were sequentially deposited.

After the electrodes 16 and 17 were formed, the i-InGaAs contact layer 11 was partially removed by wet etching method as described above, and the aperture portion 11A was formed as shown in FIG. 13. After the aperture portion 11A was formed, a SiN$_x$ (0<x≤2) protection layer was formed, and portions corresponding to the electrodes and to dicing section were removed therefrom.

After the SiN$_x$ protection layer pattern was formed, the bonded wafer 300 was separated into individual devices as shown in FIG. 14 by dicing. Thus, the light-receiving devices 100 of Example 1 were formed.

Then, the electrodes of the light-receiving device 100 were wired, and an encapsulation material was injected for packaging. The injection was performed while heat was applied to a temperature of the softening point or higher in order to soften the encapsulation material. After the injection, the temperature of the encapsulation material was lowered to room temperature, followed by the packaging.

Example 2

In Example 2, the bonded semiconductor light-receiving device 100 having the same structure shown in FIG. 27 was produced by the following procedure.

First, the device-functional layer (epi-functional layer) 10 was epitaxially grown and formed on the semi-insulating InP starting substrate 1 according to the following sequence. First, on the semi-insulating InP starting substrate 1, the i-InP buffer layer 2 having a thickness of 0.5 µm was formed, and next the i-InGaAs sacrificial layer 3 having a thickness of 0.3 µm was formed thereon. Then, on the i-InGaAs sacrificial layer 3, the i-InP etch stop layer 4 having a thickness of 0.3 µm, the i-InGaAs contact layer 11 having a thickness of 0.1 µm, the i-InP cap layer 12 having a thickness of 0.1 µm, the i-InGaAs absorption layer 13 having a thickness of 3.0 µm, and the n-InP layer 14 having a thickness of 1.0 µm were sequentially formed by epitaxial growth. Thus, the same epitaxial wafer 200 as shown in FIG. 15 was provided.

Next, on the n-InP layer 14 located at the surface 10A of the epitaxial wafer 200, the uneven pattern 10B was formed as shown in FIG. 16 by wet etching.

Next, as shown in FIG. 17, along the size of the device-planned area 10C, the trench 5 was formed by dry etching with $Cl_2$ gas.

Next, as shown in FIG. 18, on the surface of the device-functional layer 10 and on the surface of the trench 5, a $SiO_2$ film having a thickness of 0.3 µm was formed as the etching-protection film 6 by employing a p-CVD method using TEOS and $O_2$ in combination as the materials.

Next, by a photolithography method, a resist pattern was formed on portions of a surface of a portion of the etching-protection film 6, the portions corresponding to the uneven pattern 10B. Openings were formed in such portions with hydrofluoric acid. In this opening, the bonding metal layer 21 shown in FIG. 19 was vapor-deposited, which came into contact with the n-InP layer 14. Specifically, the bonding metal layer 21 including a 0.1-um Pt layer and a 1-µm Au layer was formed in the opening by the self-alignment process by which resist removal and electrode pattern formation were simultaneously performed.

Next, by a photolithography method, a resist pattern as a resist mask was formed on the surface of the portion 6A of the etching-protection film 6, the portion 6A being formed on the bottom portion 5A of the trench 5. As shown in FIG. 19, the opening pattern 6B was formed with hydrofluoric acid in the bottom portion of the trench 5 by utilizing the resist mask.

Next, as shown in FIG. 20, a Si substrate was provided as the support substrate 30, which is a substrate to be bonded. The bonding metal layer 22 including a 1-µm Pt layer and a 0.1-µm Au layer was formed the surface of the Si substrate 30.

Next, as shown in FIG. 21, the support substrate 30 and the epitaxial wafer 200 were bonded by thermocompression bonding (temperature: 400° C., pressure: 100 N/cm²) such that the bonding metal layers 21 and 22 abutted each other. Thereby, the bonded wafer 300 was formed.

Next, the bonded wafer 300 was immersed in a sulfuric acid-hydrogen peroxide mixture etchant to etch the i-InGaAs sacrificial layer 3. Thereby, the InP starting substrate 1 was separated from the device-functional layer 10 as shown in FIG. 22.

Next, the i-InP etch stop layer 4 was selectively etched with a chlorine-based etchant as described above. Then, sticking-out portions of the etching-protection film 6 were partially detached with water stream. Thereby, the i-InGaAs contact layer 11 was partially exposed as shown in FIG. 23.

After the i-InP etch stop layer 4 was removed, the $SiO_2$ film as the etching-protection film covering the sidewalls of the trench 5 was removed as shown in FIG. 24.

Then, the surface of the device-functional layer 10 was coated again with a $SiO_2$ film as the protection film 15. As shown in FIG. 25, the opening 15A was formed in a section of the protection film 15 by a photolithography method. Toward the opening 15A, Zn was diffused, and a p-type layer was formed in the surface of the opening 15A.

Then, as shown in FIG. 26, the electrode 16 was formed at sections of the opening 15A. After the electrode formation, the i-InGaAs contact layer 11 was partially removed by the wet etching method as described above, and the aperture portion 11A was formed as shown in FIG. 26. After the aperture portion 11A was formed, a $SiN_x$ ($0<x\leq2$) protection layer was formed, and portions corresponding to the electrode and to dicing section were removed therefrom.

After the $SiN_x$ protection layer pattern formation, the electrode 40 shown in FIG. 26 was formed on the backside of the support substrate 30. Then, the bonded wafer 300 was separated into individual devices as shown in FIG. 27 by dicing. Thus, the light-receiving devices 100 of Example 2 were formed.

Then, the electrodes of the light-receiving device 100 were wired, and an encapsulation material was injected for packaging. The injection was performed while heat was applied to a temperature of the softening point or higher in order to soften the encapsulation material. After the injection, the temperature of the encapsulation material was lowered to room temperature, followed by the packaging.

Comparative Example 1

In Comparative Example 1, light-receiving devices of Comparative Example 1 were prepared by the following procedure.

First, on an n-type InP substrate, a device-functional layer was formed. A device-functional layer was stacked according to the following sequence. On the n-type InP substrate, an i-InP buffer layer having a thickness of 0.5 µm was formed, and an i-InGaAs contact layer having a thickness of 0.1 µm was formed thereon to produce an epitaxial wafer.

Next, by a photolithography method, a resist pattern was formed on the surface of the device-functional layer. Based on this resist pattern, a trench was formed in the device-functional layer. Then, with the resist mask, an opening was formed in the bottom portion of the trench.

Then, Zn was diffused into the surface of the device-functional layer, and a p-type layer was formed at the surface.

Then, an electrode was formed in the opening pattern portion of the device-functional layer. In the electrode, a 0.1-µm Ti layer and a 1.0-µm Au layer were sequentially deposited.

After the electrode formation, the i-InGaAs contact layer was partially removed by wet etching method, and an aperture portion was formed. After the aperture portion formation, a $SiN_x$ ($0<x\leq2$) protection layer was formed, and portions corresponding to the electrode and to dicing section were removed therefrom.

Then, a backside contact electrode whose structure and material were the same as those described above was formed on a surface of the n-type InP substrate, the surface being located on the opposite side to the device-functional layer.

After the backside contact electrode formation, individual devices were separated by dicing. Thereby, light-receiving devices of Comparative Example 1 were formed.

Then, the electrodes of the light-receiving device were wired, and an encapsulation material was injected for packaging. The injection was performed while heat was applied to a temperature of the softening point or higher in order to soften the encapsulation material. After the injection, the temperature of the encapsulation material was lowered to room temperature, followed by the packaging.

Comparative Example 2

In Comparative Example 2, light-receiving devices were manufactured as in Example 1, except that the uneven pattern 10B was not provided on the n-InP layer 14 of the device-functional layer 10.
<Results>

FIG. 28 shows data regarding chip-delamination (disconnection) failure rates after packaging in Comparative Example 2, Example 1, and Example 2.

It can be seen that, in Example 1 and Example 2, providing the uneven pattern 10B on the bonding surface 10A of the device-functional layer 10 relative to the support substrate 30 increased the mechanical strength at the bonding interface and improved the yield against delamination failure due to temperature change during the packaging.

In contrast, it is presumed that in Comparative Example 2, sufficient bonding force was not exhibited and delamination occurred because the uneven pattern 10B was not provided on the bonding surface 10A.

Meanwhile, in Comparative Example 1, the starting substrate was used as the support substrate, but no uneven pattern was provided at the bonding surface between the device-functional layer and the starting substrate. This presumably caused poor mechanical strength at the bonding portion in the light-receiving devices of Comparative Example 1 in comparison with the light-receiving devices of Examples 1 and 2.

Moreover, FIG. 29 shows the comparison of the material costs in Examples 1 and 2 based on Comparative Example 1. It can be seen that the material costs of Examples 1 and 2 were reduced to about half of Comparative Example 1.

This is the effect of recycling the starting substrate, so that the material cost of the starting substrate was satisfactorily reduced such that the material cost became substantially ignorable and allowed additional material cost due to the increase in constituent materials.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A bonded semiconductor light-receiving device comprising:
   an epitaxial layer to serve as a device-functional layer; and
   a support substrate made of a material different from that of the device-functional layer and bonded to the epitaxial layer via a bonding material layer,
   wherein the device-functional layer has a bonding surface comprising an uneven pattern formed thereon, and
   wherein the device-functional layer comprises at least one layer made of $In_x(Ga_yAl_{1-y})_{1-x}As$ ($0.4\leq x\leq 0.6$, $0\leq y\leq 1$), and
   the layer made of $In_x(Ga_yAl_{1-y})_{1-x}As$ has a thickness of 0.1 μm or more.

2. A bonded semiconductor light-receiving device comprising:
   an epitaxial layer to serve as a device-functional layer; and
   a support substrate made of a material different from that of the device-functional layer and bonded to the epitaxial layer via a bonding material layer,
   wherein the device-functional layer has a bonding surface comprising an uneven pattern formed thereon, and
   wherein the device-functional layer comprises at least one layer made of InP, and
   the layer made of InP has a thickness of 0.1 μm or more.

3. The bonded semiconductor light-receiving device according to claim 1, wherein
   the support substrate comprises at least one material selected from the group consisting of AlN, $Al_2O_3$, Cu, GaAs, GaN, GaP, InP, Si, SiC, and $SiO_2$, and
   the material has a crystal or amorphous structure.

4. The bonded semiconductor light-receiving device according to claim 1, wherein the bonding material layer comprises at least one selected from the group consisting of benzocyclobutene (BCB), polyimide (PI), low-melting-point glass, and porous silicon oxide.

5. The bonded semiconductor light-receiving device according to claim 1, wherein the bonding material layer comprises at least one metal selected from the group consisting of Au, Ag, Al, Ga, In, Ni, Pt and Ti.

6. A method for manufacturing a bonded semiconductor light-receiving device, comprising steps of:
   epitaxially growing a device-functional layer on a starting substrate;
   providing an uneven pattern on a surface of the device-functional layer; and
   bonding a support substrate to the device-functional layer via a bonding material layer, and
   wherein
   as the device-functional layer, a product comprising at least one layer made of $In_x(Ga_yAl_{1-y})_{1-x}As$ ($0.4\leq x\leq 0.6$, $0\leq y\leq 1$) is epitaxially grown, and
   the layer made of $In_x(Ga_yAl_{1-y})_{1-x}As$ has a thickness of 0.1 μm or more.

7. A method for manufacturing a bonded semiconductor light-receiving device, comprising steps of:
   epitaxially growing a device-functional layer on a starting substrate;
   providing an uneven pattern on a surface of the device-functional layer; and
   bonding a support substrate to the device-functional layer via a bonding material layer, and
   wherein
   as the device-functional layer, a product comprising at least one layer made of InP is epitaxially grown, and
   the layer made of InP has a thickness of 0.1 μm or more.

8. The method for manufacturing a bonded semiconductor light-receiving device according to claim 6, wherein
the support substrate to be used comprises at least one material selected from the group consisting of AlN, $Al_2O_3$, Cu, GaAs, GaN, GaP, InP, Si, SiC, and $SiO_2$, and
the material has a crystal or amorphous structure.

9. The method for manufacturing a bonded semiconductor light-receiving device according to claim 6, wherein the bonding material layer to be used comprises at least one selected from the group consisting of benzocyclobutene (BCB), polyimide (PI), low-melting-point glass, and porous silicon oxide.

10. The method for manufacturing a bonded semiconductor light-receiving device according to claim 6, wherein the bonding material layer to be used comprises at least one metal selected from the group consisting of Au, Ag, Al, Ga, In, Ni, Pt and Ti.

11. A method for manufacturing a bonded semiconductor light-receiving device, comprising steps of:
epitaxially growing a device-functional layer on a starting substrate;
providing an uneven pattern on a surface of the device-functional layer; and
bonding a support substrate to the device-functional layer via a bonding material layer,
the method further comprises, before the device-functional layer is formed, a step of forming a sacrificial layer on the starting substrate,
the method further comprises, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and
the method further comprises, after the bonding step, a step of selectively etching the sacrificial layer to separate the starting substrate from the device-functional layer.

12. The method for manufacturing a bonded semiconductor light-receiving device according to claim 6,
further comprising, before the device-functional layer is formed, a step of forming a sacrificial layer on the starting substrate,
further comprising, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and
further comprising, after the bonding step, a step of selectively etching the sacrificial layer to separate the starting substrate from the device-functional layer.

13. The method for manufacturing a bonded semiconductor light-receiving device according to claim 7,
further comprising, before the device-functional layer is formed, a step of forming a sacrificial layer on the starting substrate,
further comprising, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and
further comprising, after the bonding step, a step of selectively etching the sacrificial layer to separate the starting substrate from the device-functional layer.

14. The method for manufacturing a bonded semiconductor light-receiving device according to claim 8,
further comprising, before the device-functional layer is formed, a step of forming a sacrificial layer on the starting substrate,
further comprising, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and
further comprising, after the bonding step, a step of selectively etching the sacrificial layer to separate the starting substrate from the device-functional layer.

15. The method for manufacturing a bonded semiconductor light-receiving device according to claim 9,
further comprising, before the device-functional layer is formed, a step of forming a sacrificial layer on the starting substrate,
further comprising, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and
further comprising, after the bonding step, a step of selectively etching the sacrificial layer to separate the starting substrate from the device-functional layer.

16. The method for manufacturing a bonded semiconductor light-receiving device according to claim 10,
further comprising, before the device-functional layer is formed, a step of forming a sacrificial layer on the starting substrate,
further comprising, between the step of providing an uneven pattern and the bonding step, steps of:
forming a trench in the device-functional layer along a device-planned area;
forming an etching-protection film on the surface of the device-functional layer and on a surface of the trench; and
forming an opening in the etching-protection film at a bottom portion of the trench to expose a portion of the sacrificial layer, and further comprising, after the bonding step, a step of selectively etching the sacrificial layer to separate the starting substrate from the device-functional layer.

\* \* \* \* \*